United States Patent
Fukuda et al.

(10) Patent No.: US 12,200,945 B2
(45) Date of Patent: Jan. 14, 2025

(54) MEMORY DEVICE

(71) Applicant: Kioxia Corporation, Tokyo (JP)

(72) Inventors: Kenji Fukuda, Kawasaki Kanagawa (JP); Hideyuki Sugiyama, Kawasaki Kanagawa (JP); Masahiko Nakayama, Kuwana Mie (JP); Hiroyuki Kanaya, Yokkaichi Mie (JP); Soichi Oikawa, Hachioji Tokyo (JP)

(73) Assignee: Kioxia Corporation, Tokyo (JP)

( * ) Notice: Subject to any disclaimer, the term of this patent is extended or adjusted under 35 U.S.C. 154(b) by 329 days.

(21) Appl. No.: 17/692,625

(22) Filed: Mar. 11, 2022

(65) Prior Publication Data

US 2023/0079445 A1 Mar. 16, 2023

(30) Foreign Application Priority Data

Sep. 16, 2021 (JP) .................................. 2021-151357

(51) Int. Cl.
*H01L 27/22* (2006.01)
*H10B 61/00* (2023.01)

(52) U.S. Cl.
CPC .................................. *H10B 61/10* (2023.02)

(58) Field of Classification Search
CPC .... H10N 70/826; H10N 70/883; H10N 35/00; H10N 50/10; H10N 70/881–8845; H10N 70/20–8845; G11C 2211/5615; G11C 11/161; G11C 2213/11–19; G11C 2213/30–35; G01R 33/09–098; G11B 5/39–3993; G11B 2005/3996; H03B 15/006
See application file for complete search history.

(56) References Cited

U.S. PATENT DOCUMENTS

| | | | |
|---|---|---|---|
| 7,767,993 B2 * | 8/2010 | Toda | G11C 8/14 438/102 |
| 8,389,968 B2 | 3/2013 | Sekine et al. | |
| 8,786,038 B2 | 7/2014 | Hosotani et al. | |
| 8,796,660 B2 | 8/2014 | Takagi et al. | |
| 2017/0244030 A1 * | 8/2017 | Park | H10N 70/841 |
| 2018/0277595 A1 * | 9/2018 | Miyakawa | G11C 11/1673 |
| 2019/0214430 A1 | 7/2019 | Kim et al. | |

(Continued)

FOREIGN PATENT DOCUMENTS

| | | |
|---|---|---|
| JP | 4118942 B2 | 5/2008 |
| JP | 2011066313 A | 3/2011 |

(Continued)

*Primary Examiner* — Shahed Ahmed
(74) *Attorney, Agent, or Firm* — Holtz, Holtz & Volek PC

(57) ABSTRACT

According to one embodiment, a memory device includes a first memory cell, a second memory cell adjacent to the first memory cell in a first direction, and a third memory cell adjacent to the first memory cell in a second direction, each of the first, second, and third memory cells including a resistance change memory element and a switching element. The switching element includes first and second electrodes, and a switching material layer between the first and second electrodes, the first and second electrodes overlap each other when viewed from the first direction, the first electrodes in the first and second memory cells are apart from each other, and the switching material layers in the first and second memory cells are continuously provided.

11 Claims, 47 Drawing Sheets

(56) References Cited

U.S. PATENT DOCUMENTS

| | | |
|---|---|---|
| 2020/0411759 A1 | 12/2020 | Sei et al. |
| 2021/0028229 A1 | 1/2021 | Zhang et al. |
| 2021/0257413 A1 | 8/2021 | Kanaya |
| 2022/0359007 A1* | 11/2022 | Jo .................... G11C 13/0028 |

FOREIGN PATENT DOCUMENTS

| | | |
|---|---|---|
| JP | 2012069671 A | 4/2012 |
| JP | 2021129071 A | 9/2021 |

* cited by examiner

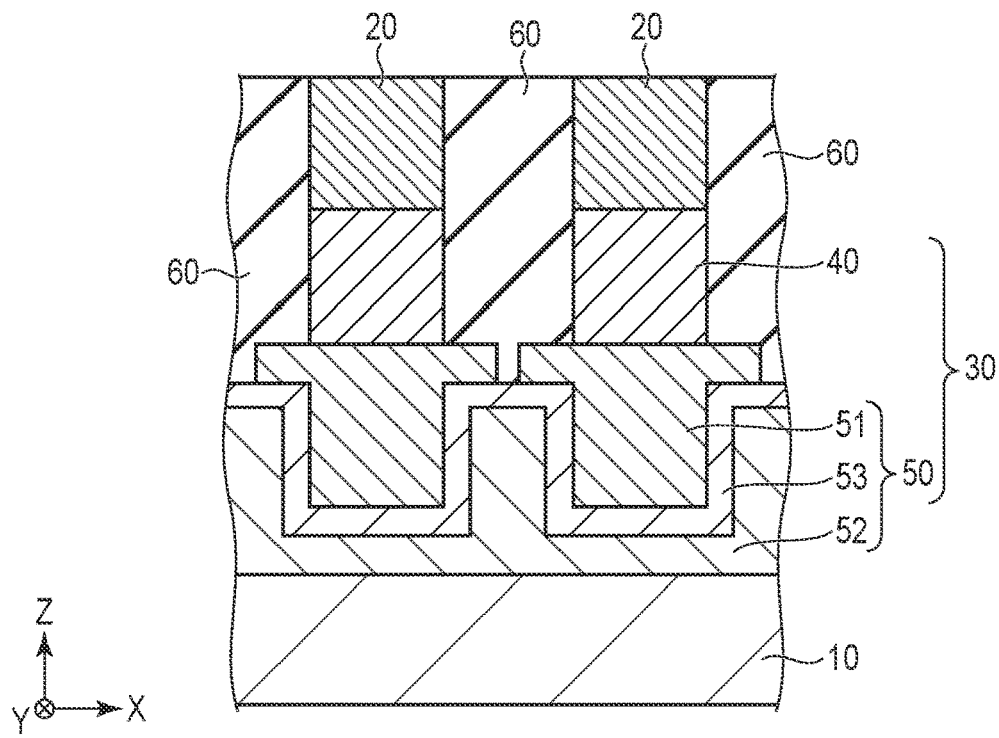
F I G. 3A
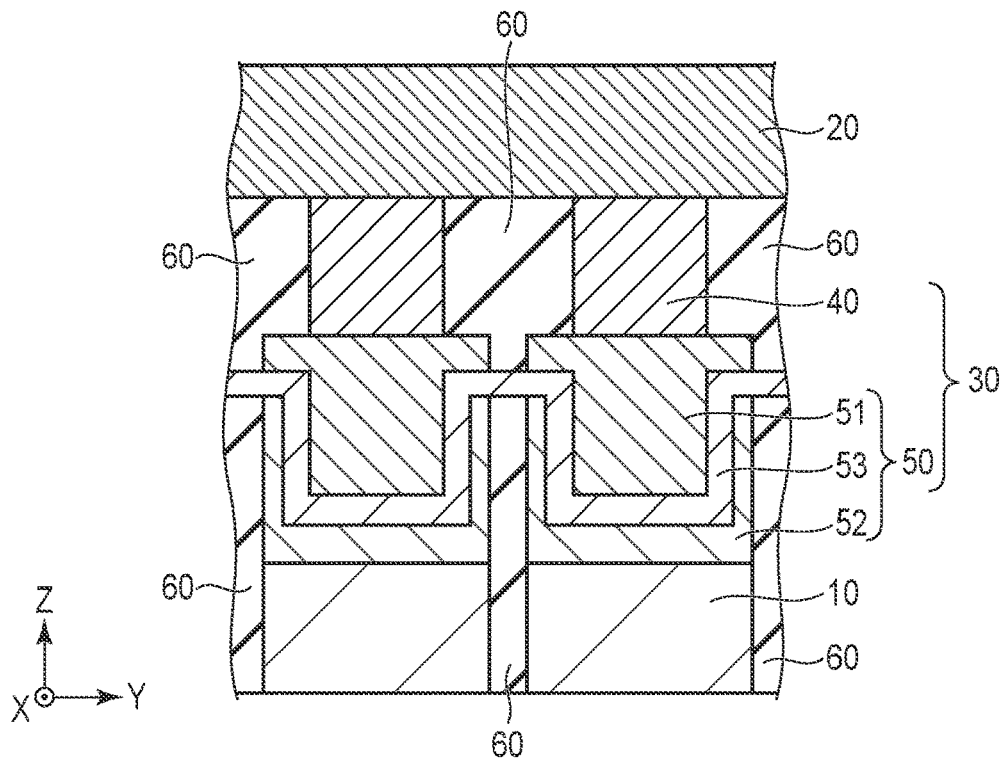
F I G. 3B

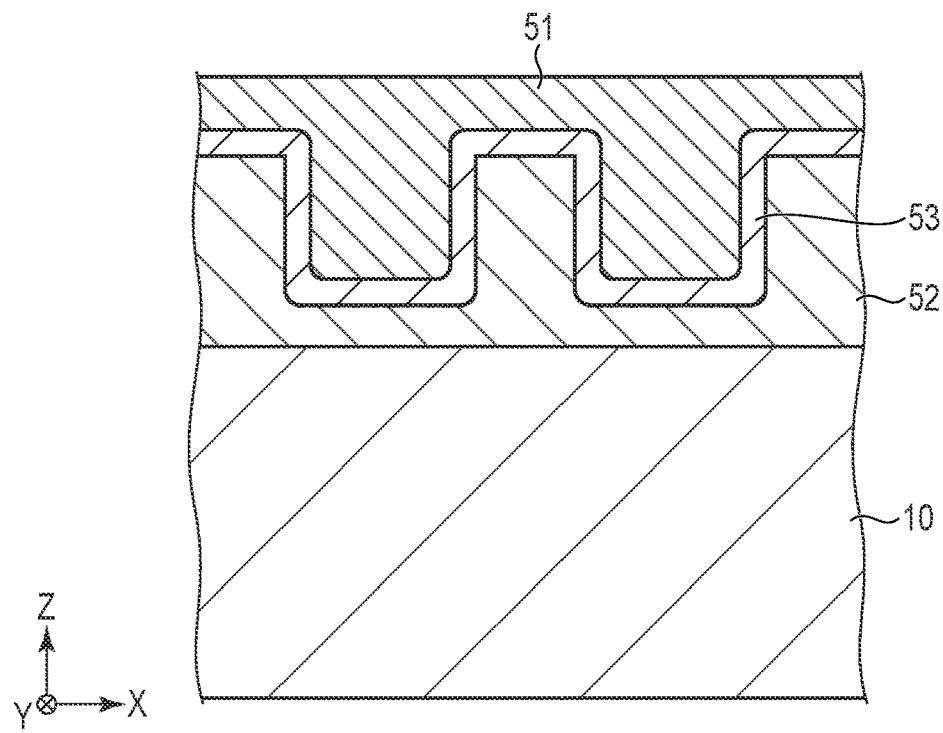
F I G. 11A
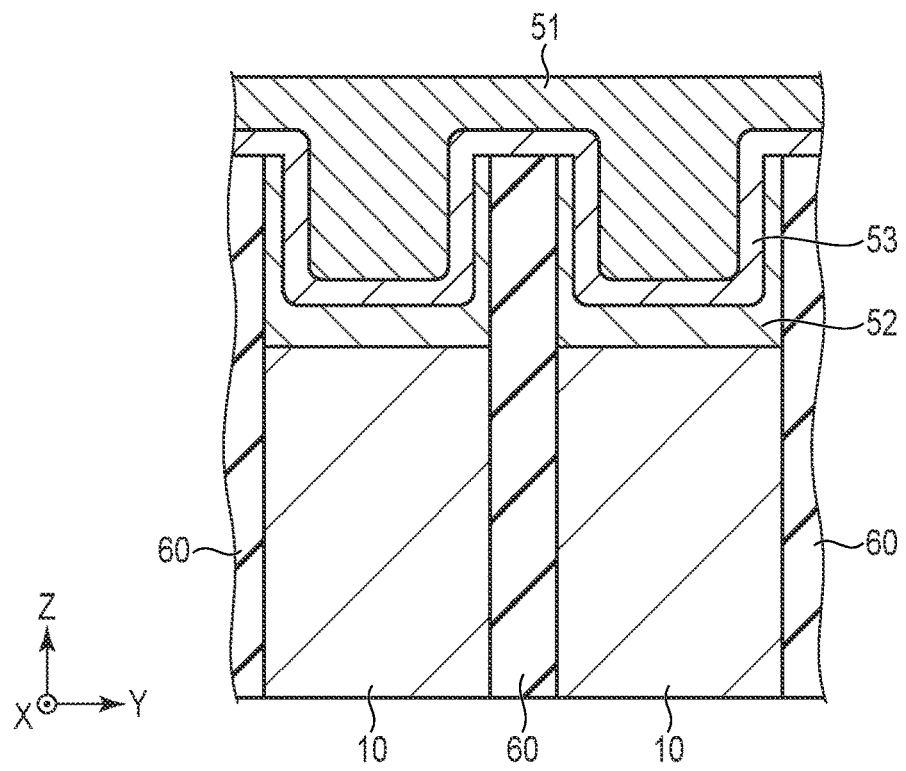
F I G. 11B

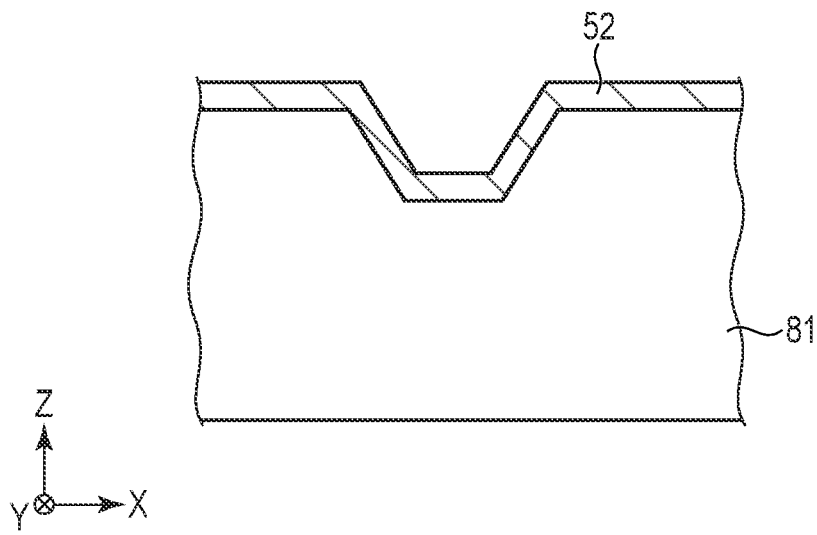
F I G. 17A
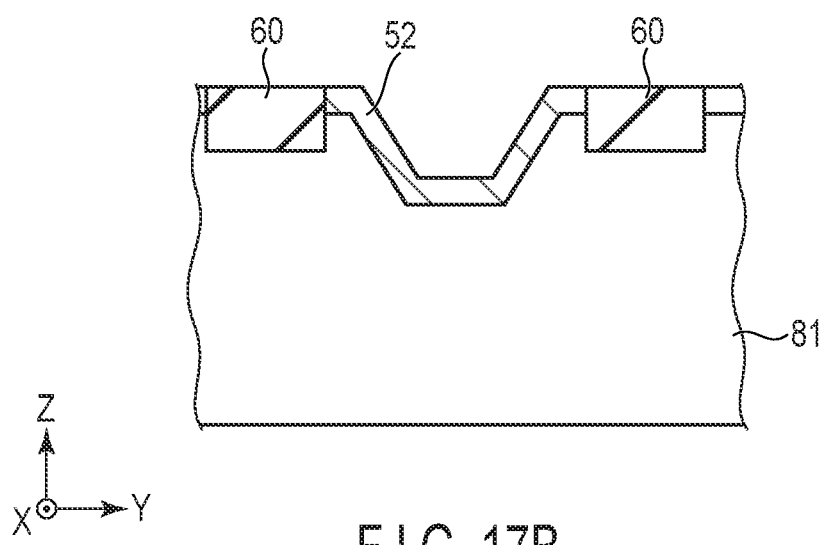
F I G. 17B

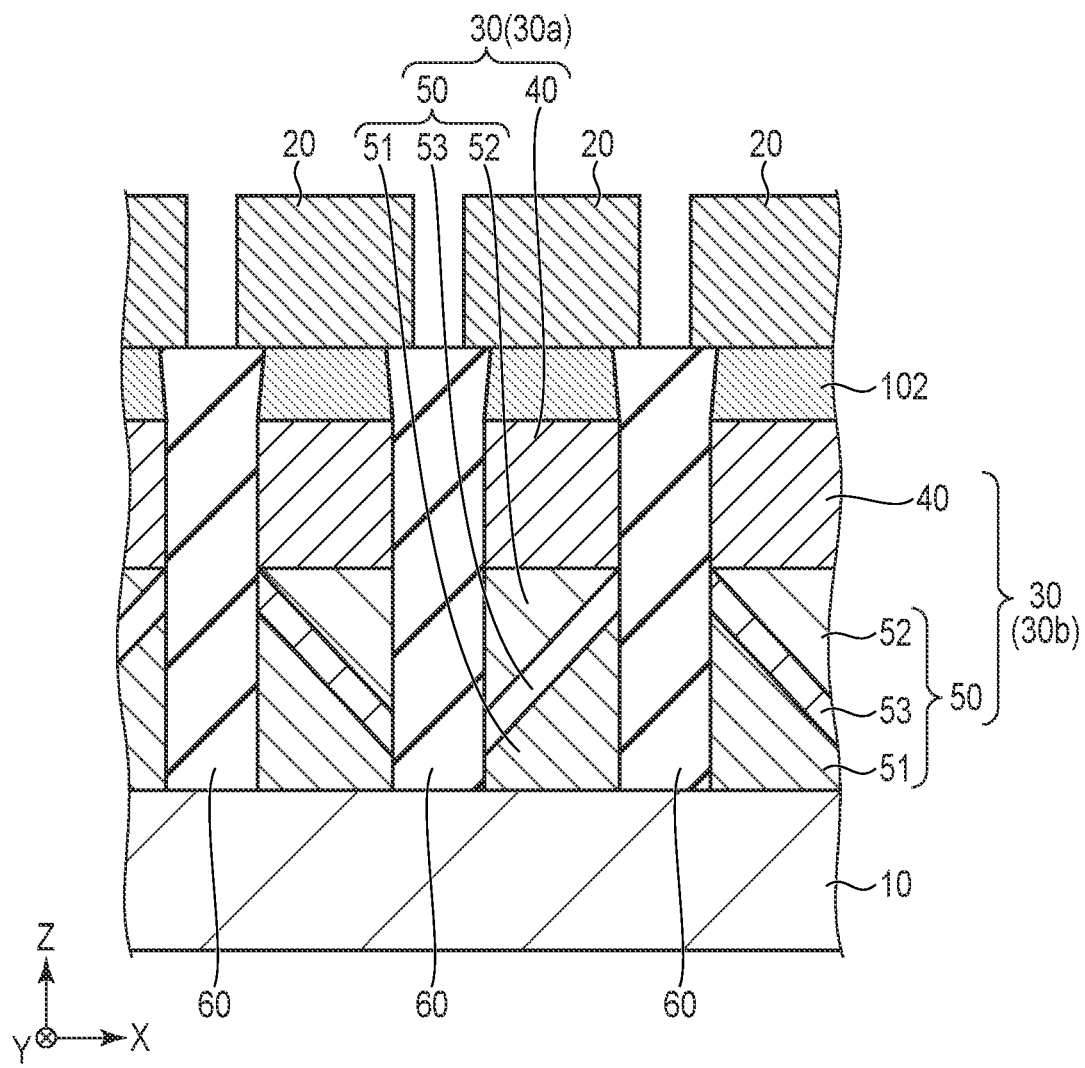
F I G. 28A

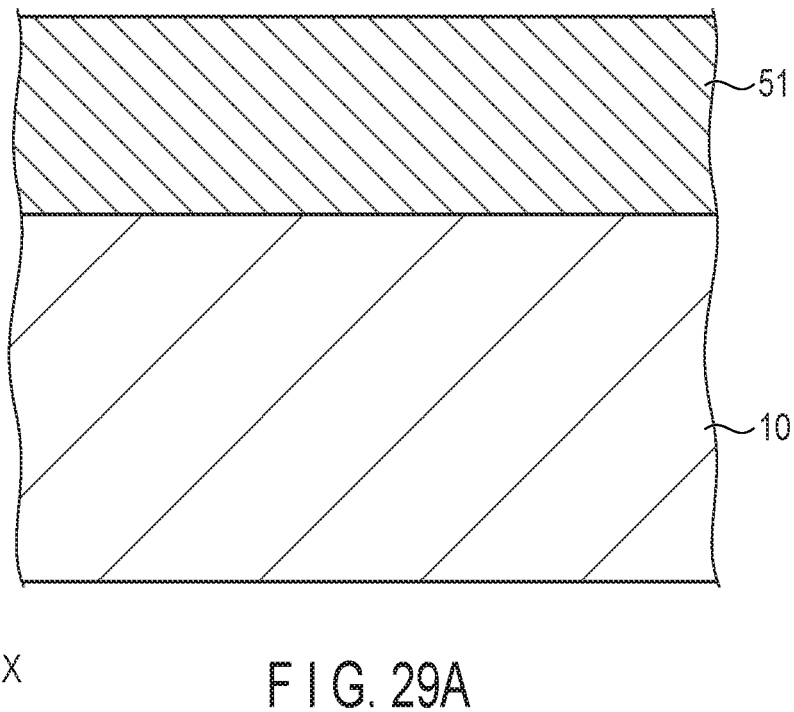
F I G. 29A
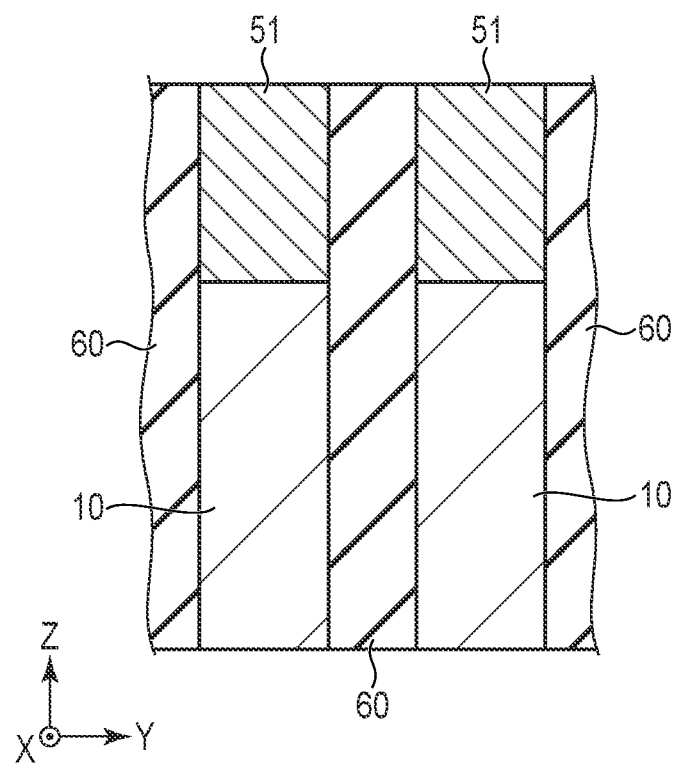
F I G. 29B

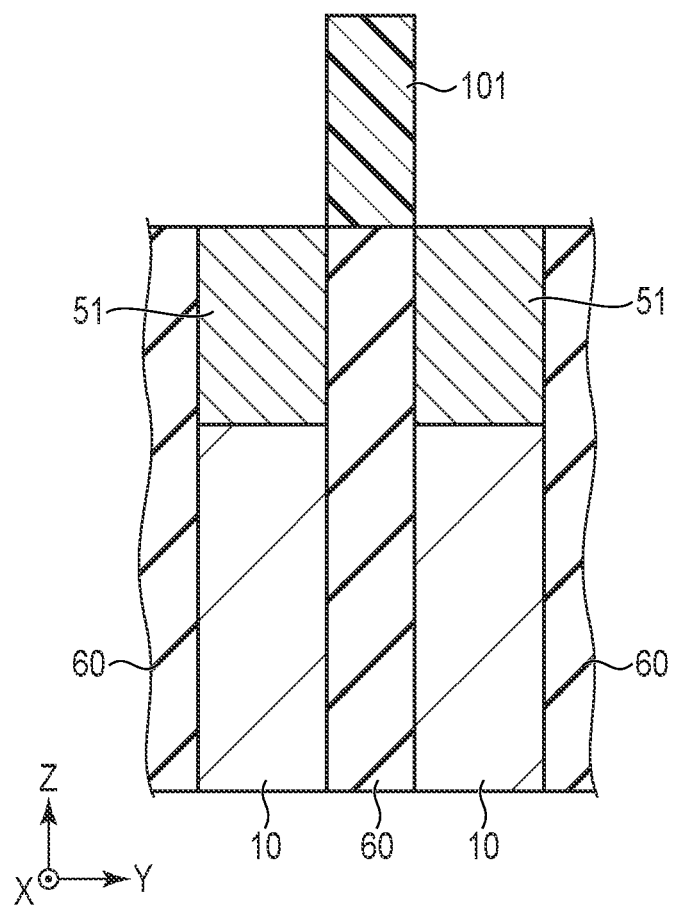
F I G. 30B

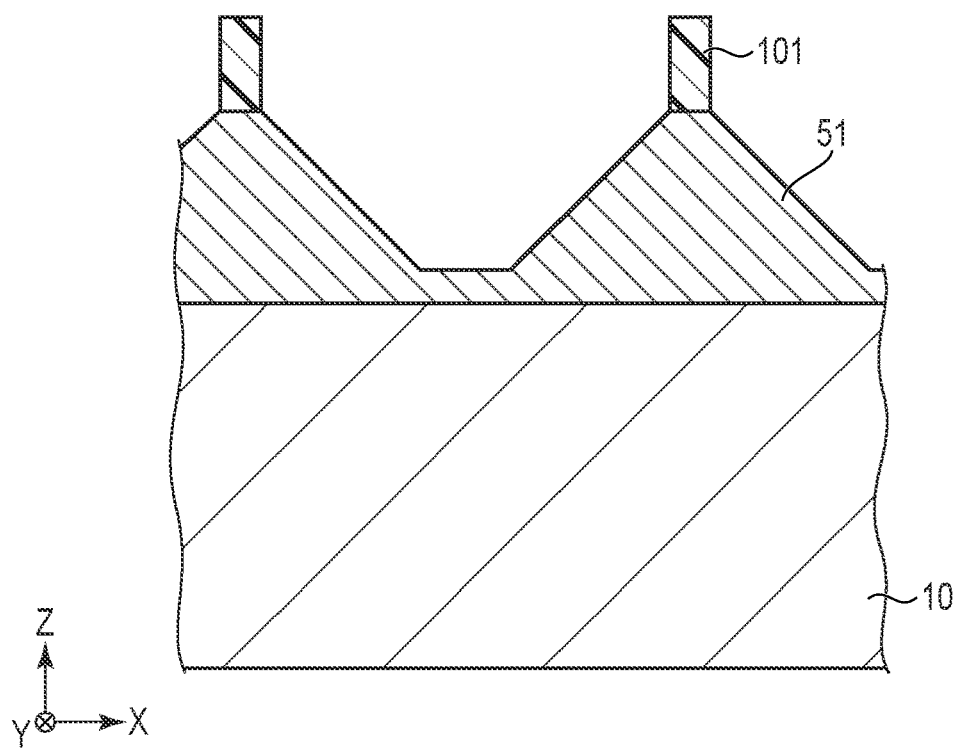
F I G. 31A
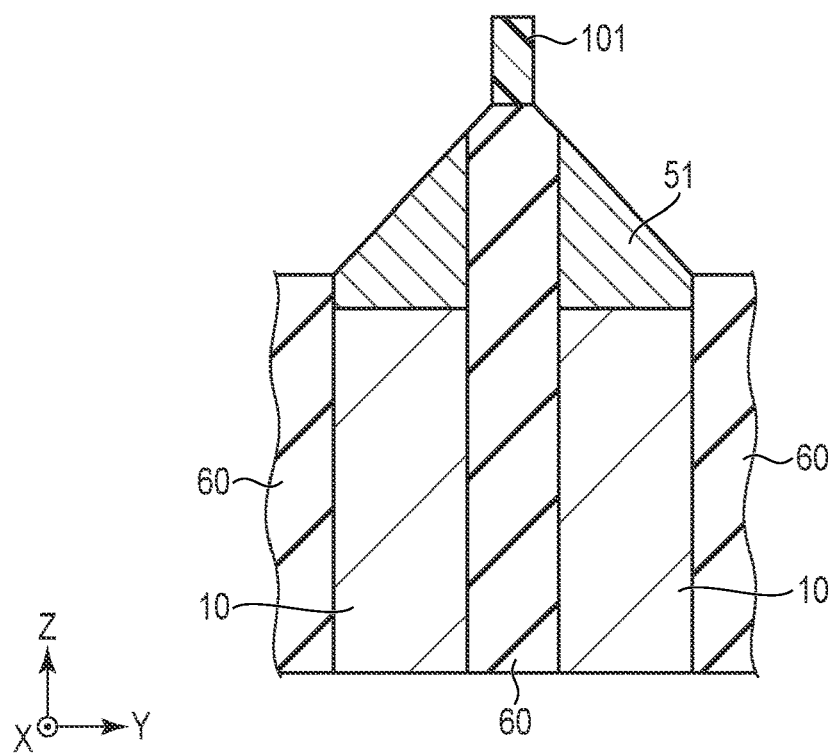
F I G. 31B

MEMORY DEVICE

CROSS-REFERENCE TO RELATED APPLICATIONS

This application is based upon and claims the benefit of priority from Japanese Patent Application No. 2021-151357, filed Sep. 16, 2021, the entire contents of which are incorporated herein by reference.

FIELD

Embodiments described herein relate generally to a memory device.

BACKGROUND

There has been proposed a nonvolatile memory device in which a resistance change memory element such as a magnetoresistance effect element and a selector (switching element) are integrated on a semiconductor substrate.

BRIEF DESCRIPTION OF THE DRAWINGS

FIGS. 3A and 3B are cross-sectional views schematically illustrating a configuration of a first modification of the memory device according to the first embodiment.

FIGS. 8A, 8B, 9A, 9B, 10A, 10B, 11A, 11B, 12A, 12B, 13A, 13B, 14A, and 14B are cross-sectional views schematically illustrating a configuration and a manufacturing method of a sixth modification of the memory device according to the first embodiment.

FIGS. 15A, 15B, 16A, 16B, 17A, 17B, 18A, 18B, 19A, 19B, 20A, 20B, 21A, 21B, 22A, and 22B are cross-sectional views schematically illustrating a configuration and a manufacturing method of a seventh modification of the memory device according to the first embodiment.

FIGS. 28A and 28B are cross-sectional views schematically illustrating a configuration of a memory device according to a second embodiment.

FIGS. 29A, 29B, 30A, 30B, 31A, 31B, 32A, 32B, 33A, 33B, 34A, 34B, 35A, 35B, 36A, and 36B are cross-sectional views schematically illustrating a manufacturing method of a memory device according to the second embodiment.

DETAILED DESCRIPTION

In general, according to one embodiment, a memory device includes: a first memory cell; a second memory cell adjacent to the first memory cell in a first direction; and a third memory cell adjacent to the first memory cell in a second direction intersecting the first direction, each of the first, second, and third memory cells including a resistance change memory element and a switching element connected in series to the resistance change memory element. The switching element included in each of the first, second, and third memory cells includes a first electrode, a second electrode, and a switching material layer provided between the first electrode and the second electrode, the first electrode and the second electrode of the switching element included in each of the first, second, and third memory cells over each other when viewed from the first direction, the first electrode of the switching element included in the first memory cell and the first electrode of the switching element included in the second memory cell are apart from each other, and the switching material layer of the switching element included in the first memory cell and the switching material layer of the switching element included in the second memory cell are continuously provided.

Hereinafter, embodiments will be described with reference to the drawings.

First Embodiment

Figure 1A:
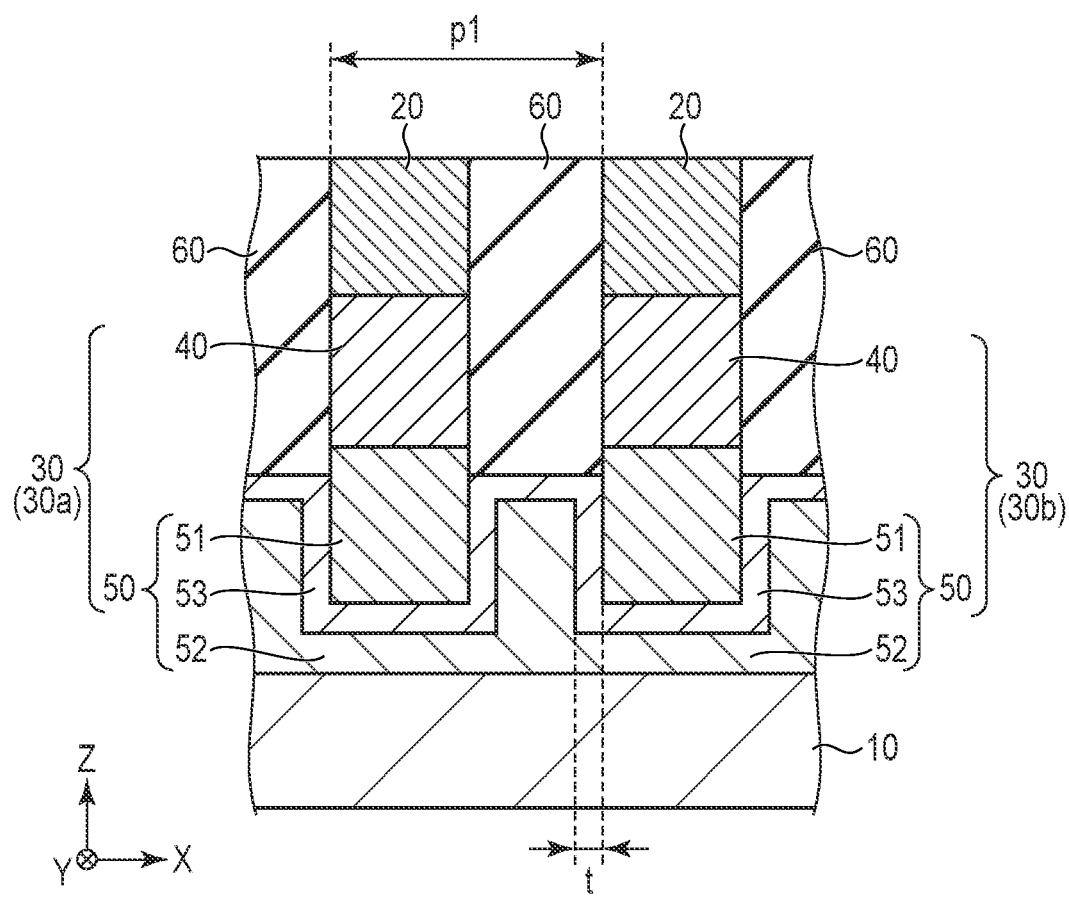
FIGS. 1A, 1E, and 1C are cross-sectional views schematically illustrating a configuration of a memory device according to a first embodiment.
Figure 1B:
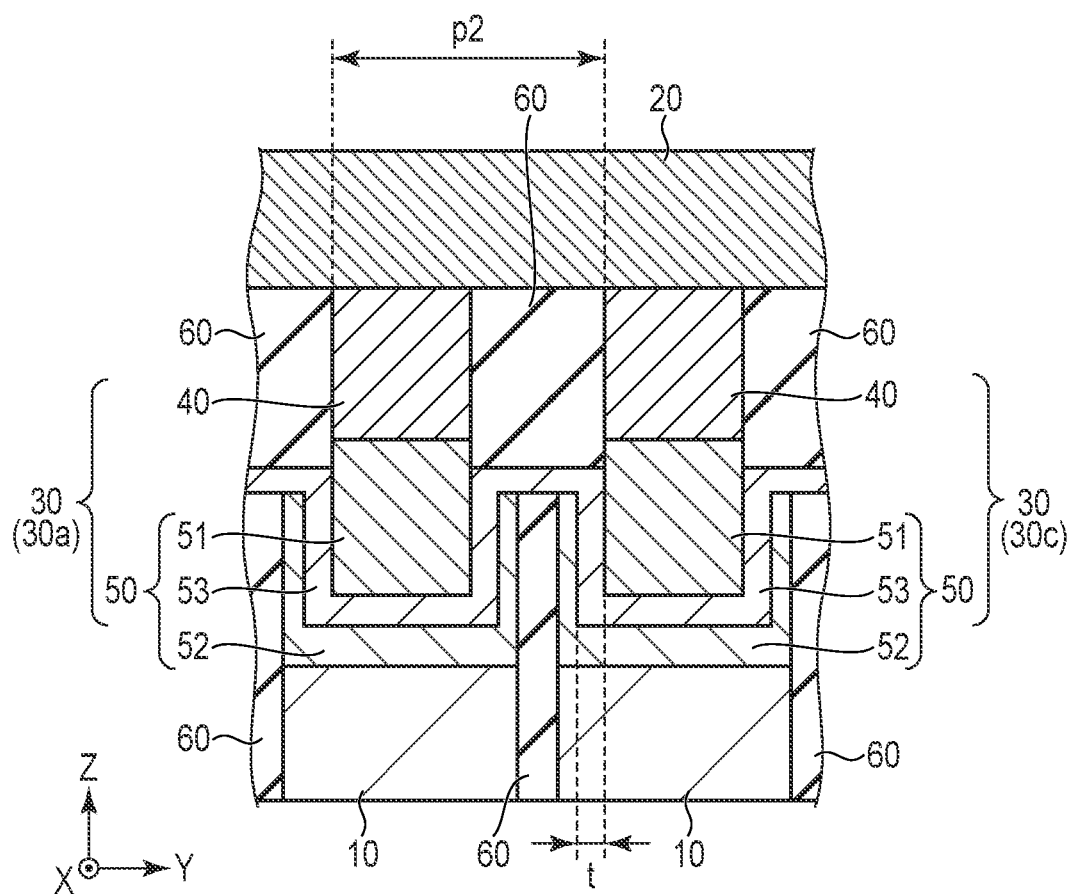

FIGS. 1A and 1B each are cross-sectional views schematically illustrating a configuration of a nonvolatile memory device according to a first embodiment. FIG. 1A is a cross-sectional view parallel to an X direction, and FIG. 13 is a cross-sectional view parallel to a Y direction. Note that the X direction, the Y direction, and a Z direction are directions crossing each other. Specifically, the X direction, the Y direction, and the Z direction are directions orthogonal to each other.

As illustrated in FIGS. 1A and 1B, a plurality of memory cells 30 are connected between a plurality of first wirings 10 extending in the X direction and a plurality of second wirings 20 extending in the Y direction. One of the first wiring 10 and the second wiring 20 corresponds to a word line, and the other of the first wiring 10 and the second wiring 20 corresponds to a bit line. The memory cell 30 includes a magnetoresistance effect element (resistance change memory element) 40 and a selector (switching element) 50 connected in series to the magnetoresistance effect element 40. An interlayer insulating film 60 is provided in a region between the adjacent memory cells 30. The above-described structure is provided on a semiconductor substrate (not illustrated).

Figure 2:
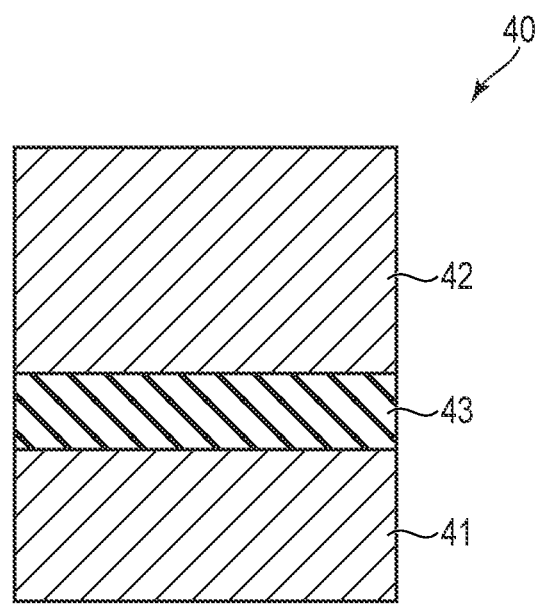
FIG. 2 is a cross-sectional view schematically illustrating a configuration of a magnetoresistance effect element included in the memory device according to the first embodiment.

FIG. 2 is a cross-sectional view schematically illustrating a configuration of the magnetoresistance effect element 40.

The magnetoresistance effect element 40 includes a storage layer (first magnetic layer) 41, a reference layer (second magnetic layer) 42, and a tunnel barrier layer (nonmagnetic layer) 43.

The storage layer file a ferromagnetic layer having a variable magnetization direction. The reference layer 42 is a ferromagnetic layer having a fixed magnetization direction. The tunnel barrier layer 43 is an insulating layer provided between the storage layer 41 and the reference layer 42. Note that the variable magnetization direction means that the magnetization direction changes with respect to a predetermined write current. The fixed magnetisation direction means that the magnetisation direction does not change with respect to the predetermined write current.

When the magnetization direction of the storage layer 41 is parallel to the magnetization direction of the reference layer 42, the magnetoresistance effect element 40 is in a relatively low resistance state. When the magnetization direction of the storage layer 41 and the magnetization direction, of the reference layer 42 are antiparallel, the magnetoresistance effect element 40 is in a relatively high resistance state. Therefore, the magnetoresistance effect element 40 can store binary data according to the resistance state (low resistance state and high resistance state). In addition, the magnetoresistance effect element 40 may be set in the low resistance state or the high resistance state according to the direction of the write current.

Note that, in the example illustrated in FIG. 2, the storage layer 41 is provided on a lower layer side and the reference layer 42 is provided on an upper layer side, hut the storage layer 41 may be provided on the upper layer side and the reference layer 42 may be provided on the lower layer side.

Next, a configuration of the selector 50 will be described with reference to FIGS. 1A and 1B.

The selector 50 includes a first electrode 51, a second electrode 52, and a selector material layer (switching material layer) 53 provided between the first electrode 51 and the second electrode 52.

Note that the first electrode 51 of the selector 50 is shared with a bottom electrode of the magnetoresistance effect element 40, but may not be shared therewith. In addition, the second wiring 20 is shared with a top electrode of the magnetoresistance effect element 40, but may not be shared therewith. In addition, the second electrode 52 of the selector 50 may be shared with the first wiring 10. In this case, a thickness of the selector 50 can be reduced.

The first electrode 51 and the second electrode 52 are formed of the same conductive material. For example, the first electrode 51 and the second electrode 52 are formed of platinum. (Pt), palladium (Pd), tungsten (W), ruthenium (Ru), nickel (Ni), titanium (Ti), titanium nitride (TiN), copper (Cu), molybdenum (Mo), or the like. By forming the first electrode 51 and the second electrode 52 of the same conductive material, it is possible to make a current-voltage characteristic in a positive direction and a current-voltage characteristic in a negative direction of the selector 50 symmetric.

The selector material layer 53 is formed of amorphous silicon (a-Si), silicon oxide ($SiO_2$), silicon nitride ($SiN_x$), tantalum oxide ($Ta_2O_5$, $TaO_x$), tantalum nitride (TaN), titanium oxide ($TiO_2$), zinc oxide (ZnO), or the like.

The selector 50 has a diode type current-voltage characteristic, and has a characteristic in which a resistance value rapidly decreases as a voltage applied between two terminals increases.

Here, the memory cells 30 adjacent in the X direction are defined as a first memory cell 30a and a second memory cell 30b, and the memory cells 30 adjacent in the Y direction are defined as the first memory cell 30a and a third memory cell 30c.

When defined as described above, the first electrode 51 and the second electrode 52 of the selector 50 included in each of the first memory cell 30a, the second memory cell 30b, and the third memory cell 30c overlap each other when viewed from the X direction. In addition, when viewed from the Y direction, the first electrode 51 and the second electrode 52 of the selector 50 included in each of the first memory cell 30a, the second memory cell 30b, and the third memory cell 30c overlap each other. Specifically, the selector material layer 53 of the selector 50 has a recess, at least a part of the first electrode 51 is provided inside the recess of the selector material layer 53, and at least a part of the second electrode 52 is provided outside the recess of the selector material layer 53. In other words, both a contact area between the first electrode 51 and the selector material layer 53 and a contact area between the second electrode 52 and the selector material layer 55 are also larger than that (an area of a pattern of the magnetoresistance effect element 40 viewed from the Z direction) of the magnetoresistance effect element 40.

In addition, the first electrode 51 of the selector 50 included in the first memory cell 30a and the first electrode 51 of the selector 50 included in the second memory cell 30b are apart from each other. Similarly, the first electrode 51 of the selector 50 included in the first memory cell 30a and the first electrode 51 of the selector 50 included in the third memory cell 30c are apart from each other.

In addition, the selector material layer 53 of the selector 50 included in the first memory cell 30a and the selector material layer 53 of the selector 50 included in the second memory cell 30b are continuously provided. Similarly, the selector material layer 53 of the selector 50 included in the first memory cell 30a and the selector material layer 53 of the selector 50 included in the third memory cell 30c are continuously provided.

In addition, the second electrode 52 of the selector 50 included in the first memory cell 30a and the second electrode 52 of the selector 50 included in the second memory cell 30b are continuously provided, and the second electrode 52 of the selector 50 included in the first memory cell 30a and the second electrode 52 of the selector 50 included in the third memory cell 30c are apart from each other.

In addition, a thickness t of the selector material layer 53 is thinner than half of a pitch p1 between the first memory cell 30a and the second memory cell 30b and is thinner than half of a pitch p2 between the first memory cell 30a and the third memory cell 30c. That is, relationships of $t<p1/2$ and $t<p2/2$ are satisfied.

This is because when the above-described relationship is not satisfied, a region between the first electrodes 51 of the selector 50 included in the adjacent memory cells 30 is filled with the selector material layer 53, and the second electrode 52 of the selector 50 cannot be provided in a region between the first electrodes 51.

In addition to the above relationship, it is preferable that relationships of $t>p1/4$ and $t>p2/4$ are satisfied.

As described above, in the present embodiment, the first electrode 51 and the second electrode 52 of the selector 50 overlap each other. Therefore, a cross-sectional area of a current pass between the first electrode 51 and the second electrode 52 can increase, and an on-current of the selector 50 can increase. As a result, the write current and the read current to and from the memory cell 30 can increase, and an excellent memory device can be obtained.

Figure 1C:
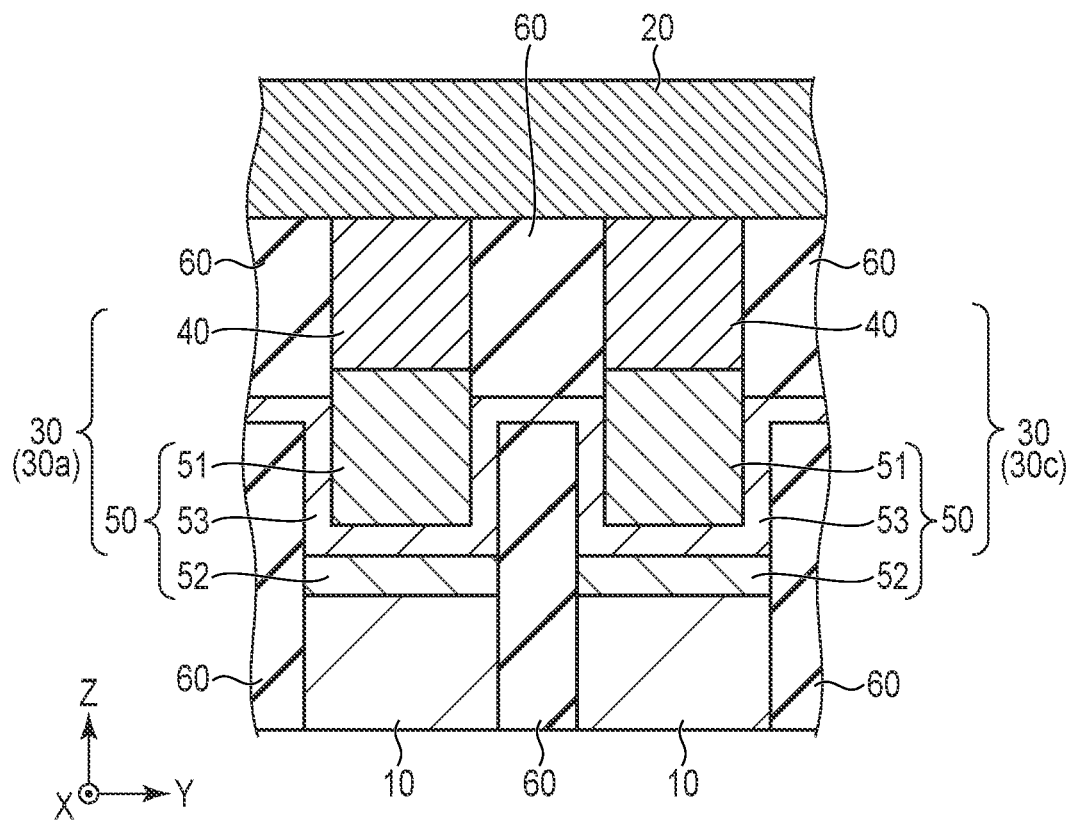

Note that, in the present embodiment, as illustrated in FIG. 1C, the first electrode 51 and the second electrode 52 may not overlap each other when viewed from the X direction. The same applies to first, third, fourth, and sixth modifications described later.

FIGS. 3A and 3B are cross-sectional views schematically illustrating a configuration of the first modification of the memory device according to the present embodiment. In the present modification, an area of the upper surface of the first electrode 51 of the selector 50 is larger than that of the lower surface of the first electrode 51 and that (an area of the pattern of the magnetoresistance effect element 40 viewed from the Z direction) of the magnetoresistance effect element 40. Also in the present modification, it is possible to obtain the same effects as those of the above-described embodiment.

Figure 4A:
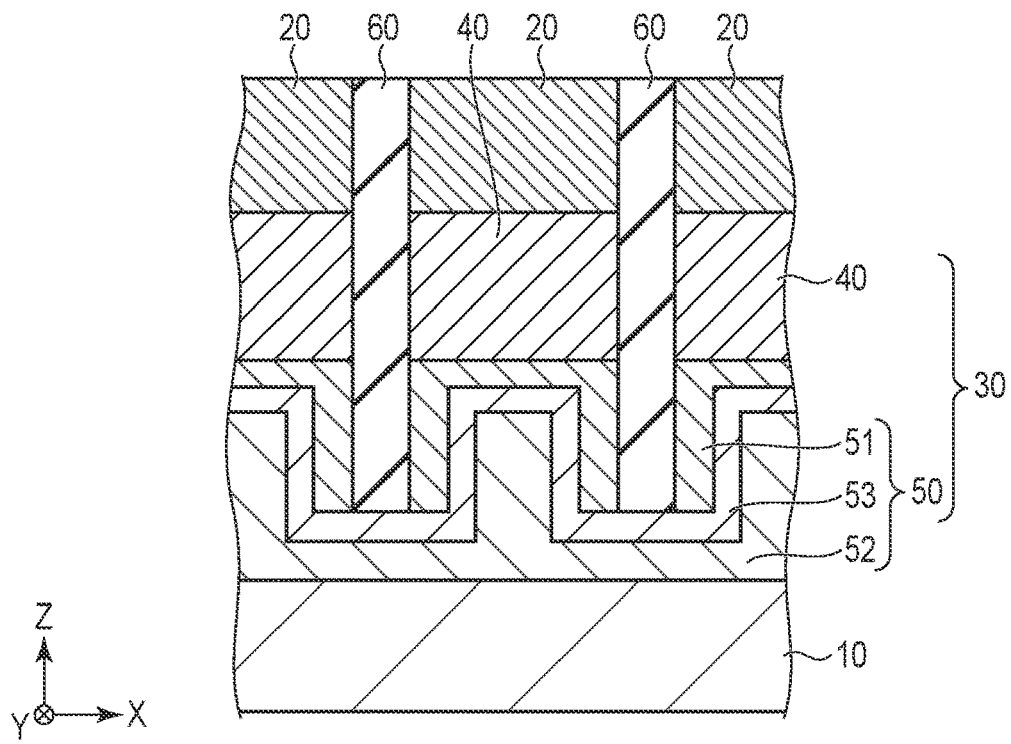
FIGS. 4A and 4B are cross-sectional views schematically illustrating a configuration of a second modification of the memory device according to the first embodiment.
Figure 4B:
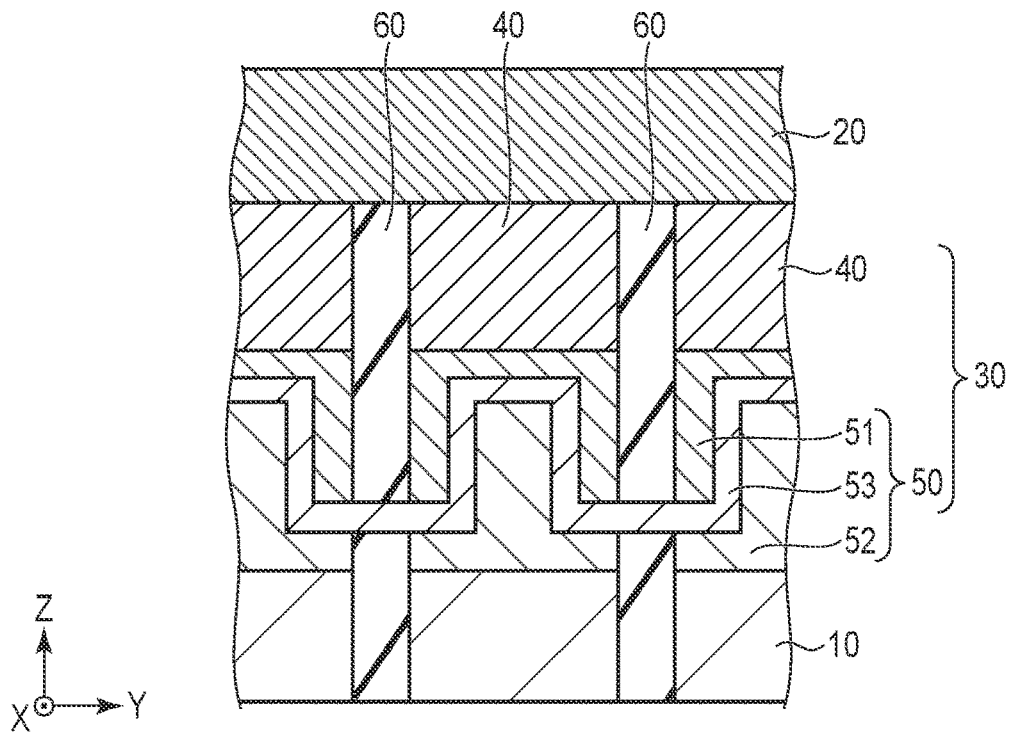

FIGS. 4A and 4B are cross-sectional views schematically illustrating a configuration of the second modification of the memory device according to the present embodiment. In the embodiment and the first modification described above, the selector material layer 53 constituting the selector 50 is recessed downward at a position corresponding to the position of the magnetoresistance effect element 40, but in the present modification, the selector material layer 53 constituting the selector 50 is recessed upward at a position corresponding to the position of the magnetoresistance effect element 40. Also in the present modification, it is possible to obtain the same effects as those of the above-described embodiment.

Figure 5A:
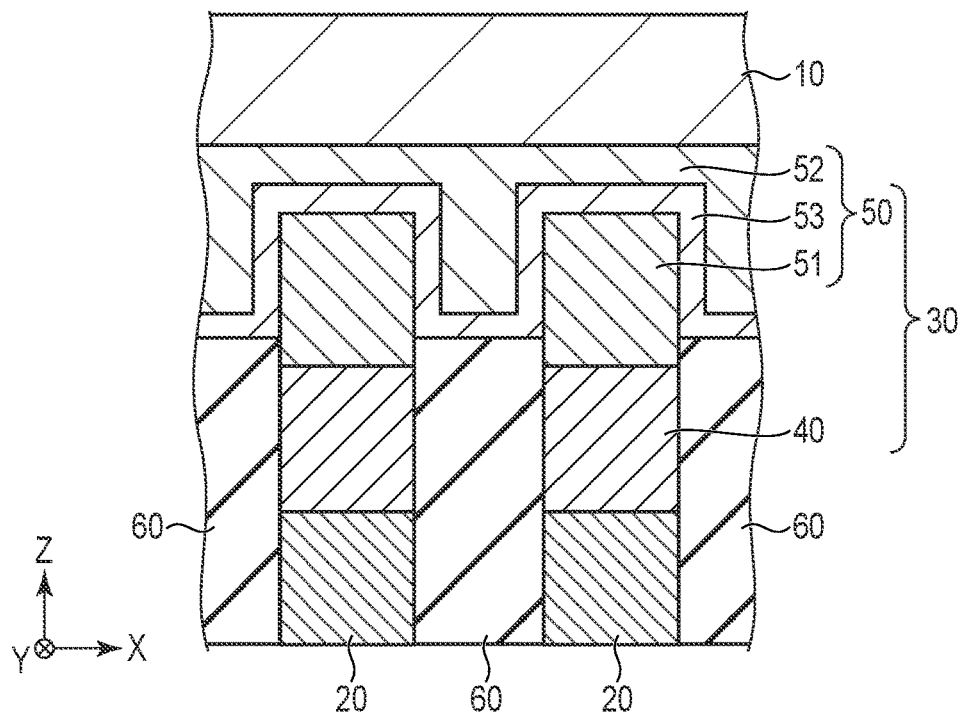
FIGS. 5A and 5B are cross-sectional views schematically illustrating a configuration of a third modification of the memory device according to the first embodiment.
Figure 5B:
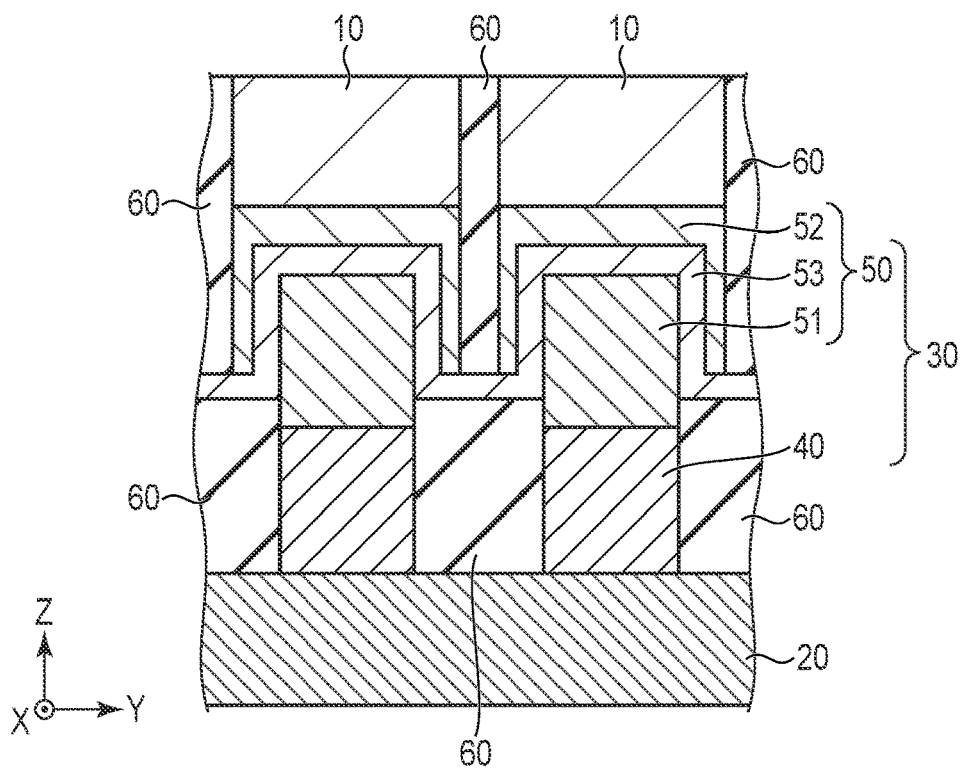

FIGS. 5A and 5B are cross-sectional views schematically illustrating a configuration of the third modification of the memory device according to the present embodiment. FIG. 5A is a cross-sectional view parallel to an X direction, and FIG. 5B is a cross-sectional view parallel to a Y direction.

In the above-described embodiment, the magnetoresistance effect element 40 is provided on the upper layer side (side far from the semi conductor substrate (not illustrated)) and the selector 50 is provided on the lower layer side (side close to the semiconductor substrate), but in the present modification, the magnetoresistance effect element 40 is provided on the lower layer side and the selector 50 is provided on the upper layer side. Therefore, in the present modification, the selector material layer 53 constituting the selector 50 is recessed upward at a position corresponding to the position of the magnetoresistance effect element 40. Also in the present modification, it is possible to obtain the same effects as those of the above-described embodiment.

Note that the first electrode 51 of the selector 50 is shared with the top electrode of the magnetoresistance effect element 40, but may not be shared therewith. In addition, the second wiring 20 is shared with the bottom electrode of the magnetoresistance effect element 40, but may not be shared therewith. In addition, the second electrode of the selector 50 may be shared with the first wiring 10. In this case, a thickness of the selector 50 can be reduced.

Figure 6A:
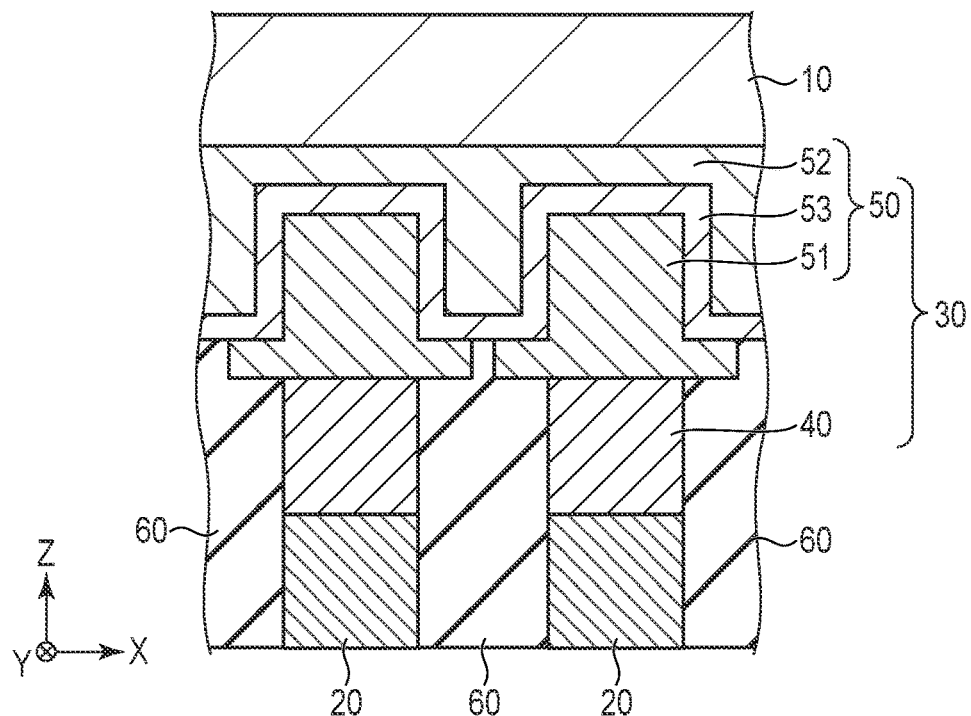
FIGS. 6A and 6B are cross-sectional views schematically illustrating a configuration of a fourth modification of the memory device according to the first embodiment.
Figure 6B:
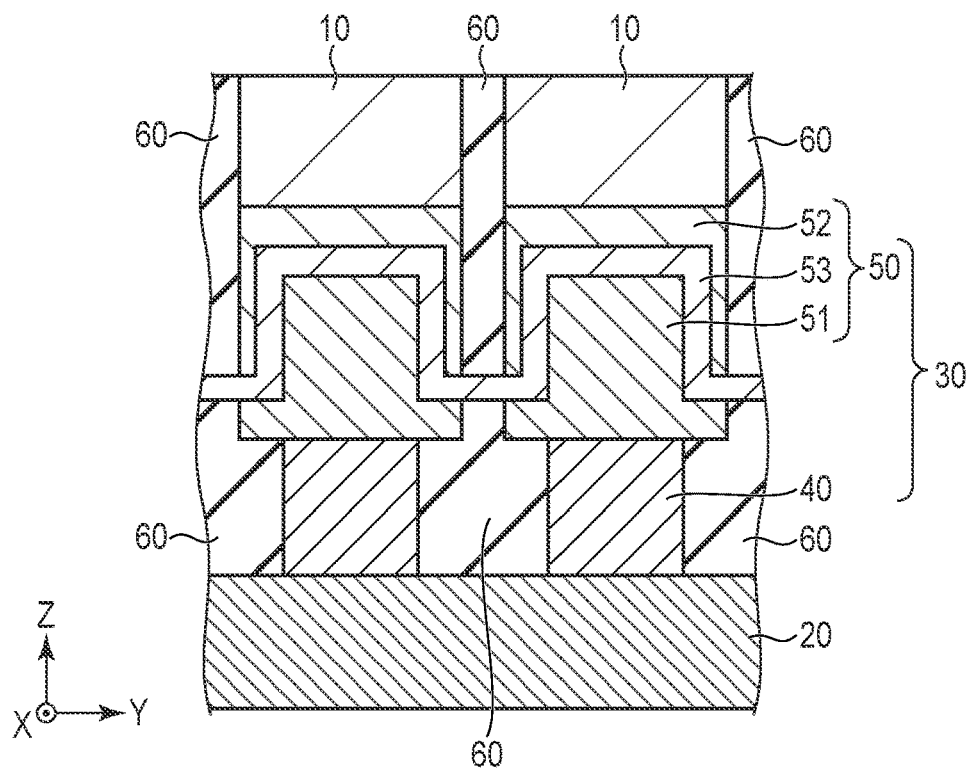

FIGS. 6A and 6B are cross-sectional views schematically illustrating a configuration of the fourth modification of the memory device according to the present embodiment. Also in the present modification, similarly to the third modification, the magnetoresistance effect element 40 is provided on the lower layer side, and the selector 50 is provided on the upper layer side. Also in the present modification, it is possible to obtain the same effects as those of the above-described embodiment.

Figure 7A:
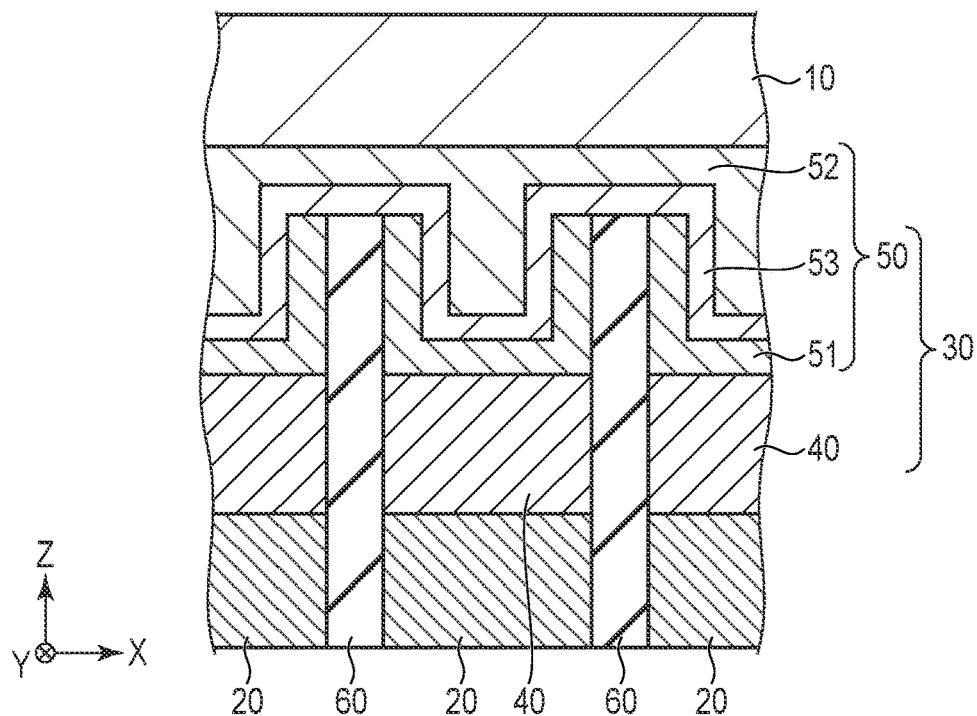
FIGS. 7A and 7B are cross-sectional views schematically illustrating a configuration of a fifth modification of the memory device according to the first embodiment.
Figure 7B:
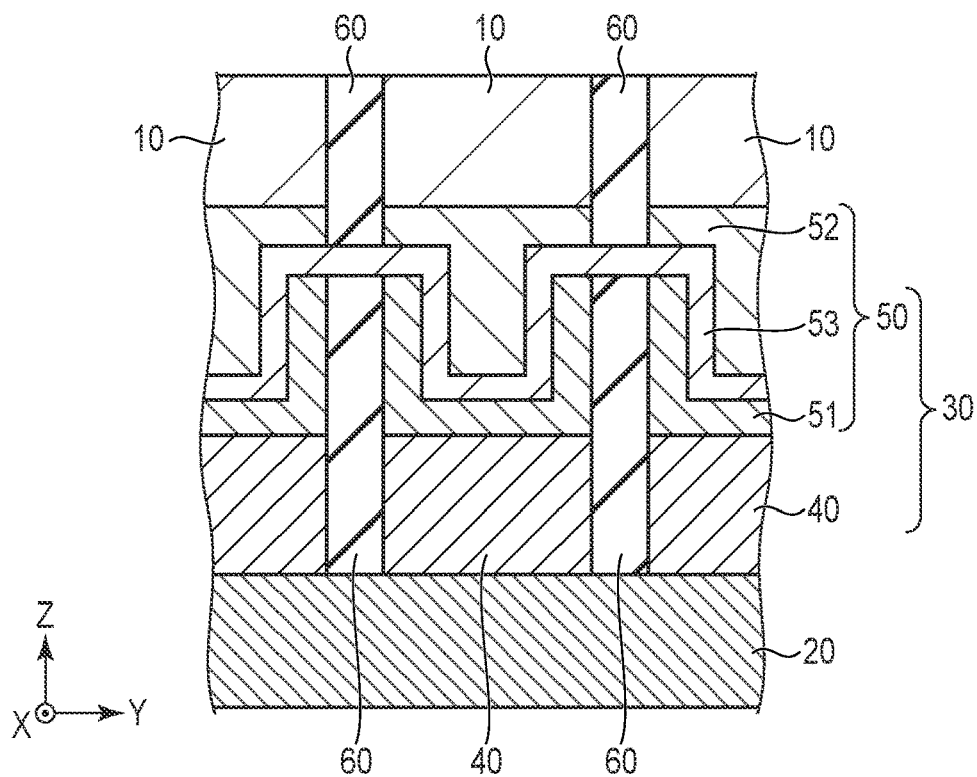

FIGS. 7A and 7B are cross-sectional views schematically illustrating a configuration of the fifth modification of the memory device according to the present embodiment. Also in the present modification, similarly to the third modification, the magnetoresistance effect element 40 is provided on the lower layer side, and the selector 50 is provided on the upper layer side. Also in the present modification, it is possible to obtain the same effects as those of the above-described embodiment.

FIGS. 8A and 8B to 14A and 14B are cross-sectional views schematically illustrating a configuration and a manufacturing method of a sixth modification of the memory device according to the present embodiment. FIGS. 8A to 14A are cross-sectional views parallel to the X direction, and FIGS. 8B to 14B are cross-sectional views parallel to the Y direction.

Figure 8A:
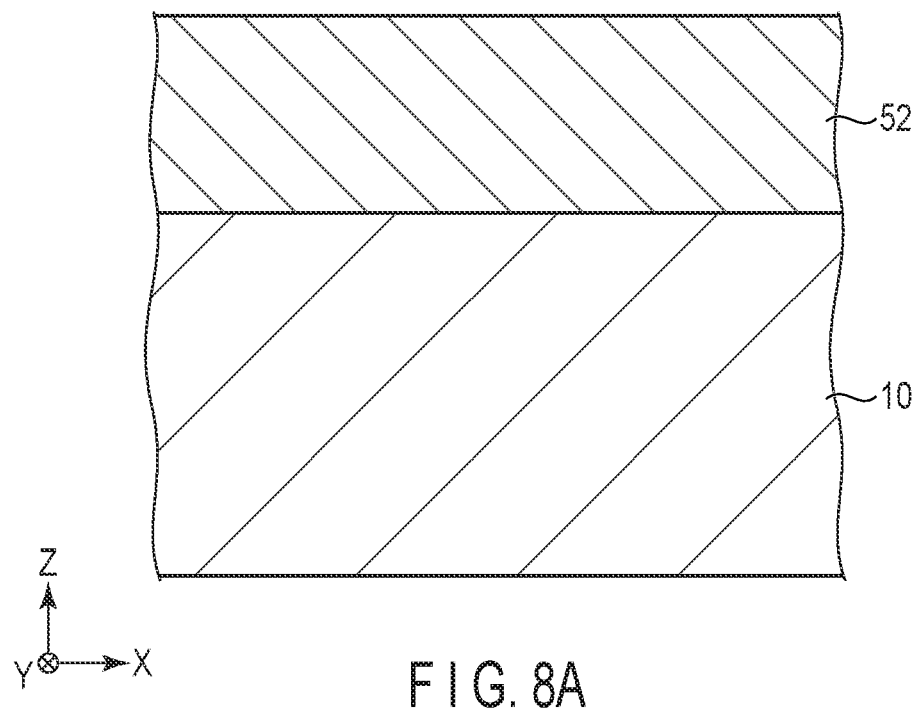
Figure 8B:
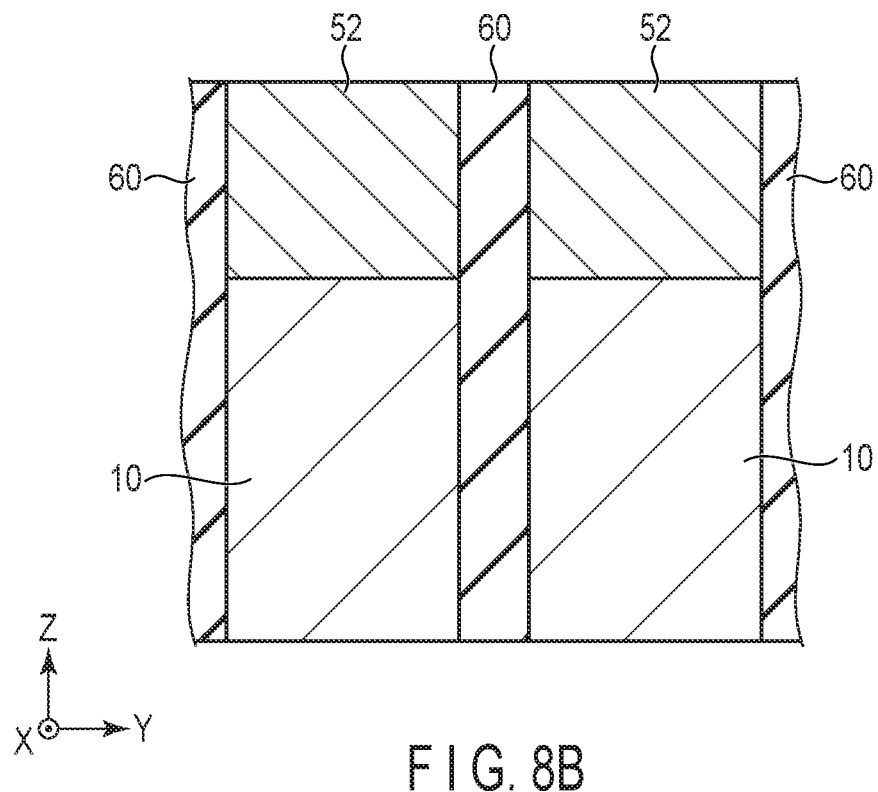

First, as illustrated in FIGS. 8A and 8B, a line pattern for the first wiring 10 and the second electrode 52 of the selector 50 is formed on a lower structure (not illustrated) including a semiconductor substrate (not illustrated). Subsequently, the region between the line patterns is filled with the interlayer insulating film 60.

Figure 9A:
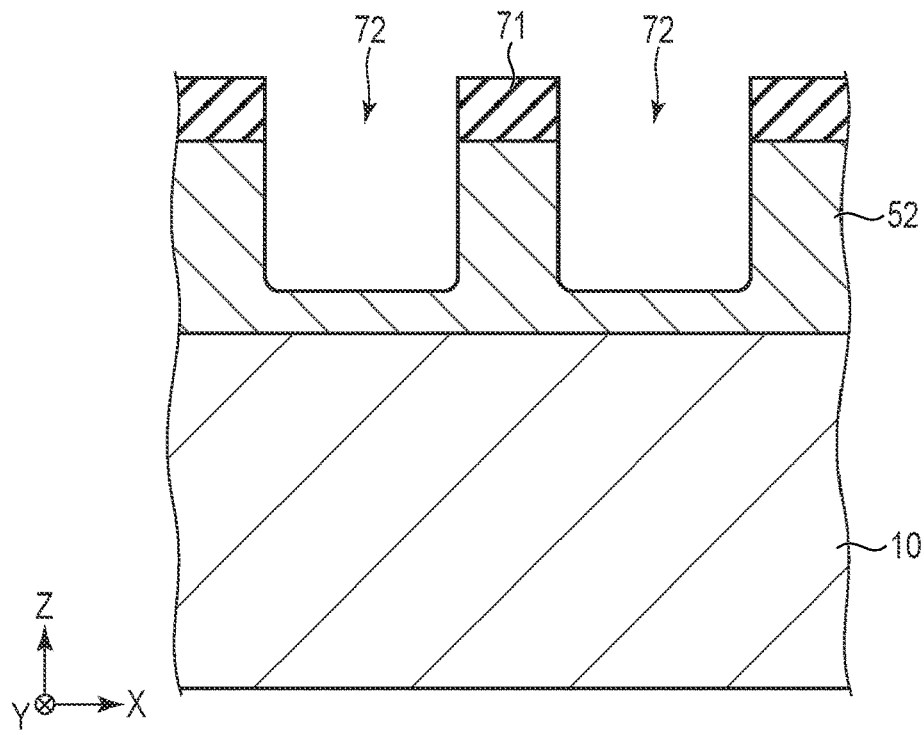
Figure 9B:
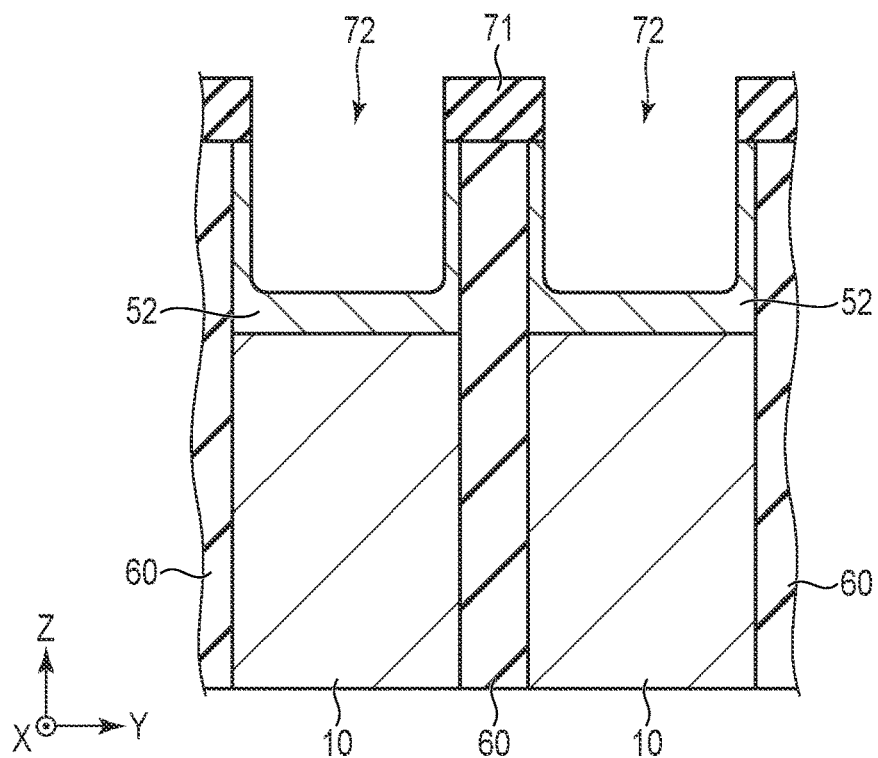

Next, as illustrated in FIGS. 9A and 9B, a mask pattern 71 is formed on the structure obtained in the step of FIGS. 8A and 8B. Further, a pattern for the second electrode 52 is etched using the mask pattern 71 as a mask to form a trench 72. A corner defined by a bottom surface and a side surface of the trench 72 is rounded.

Figure 10A:
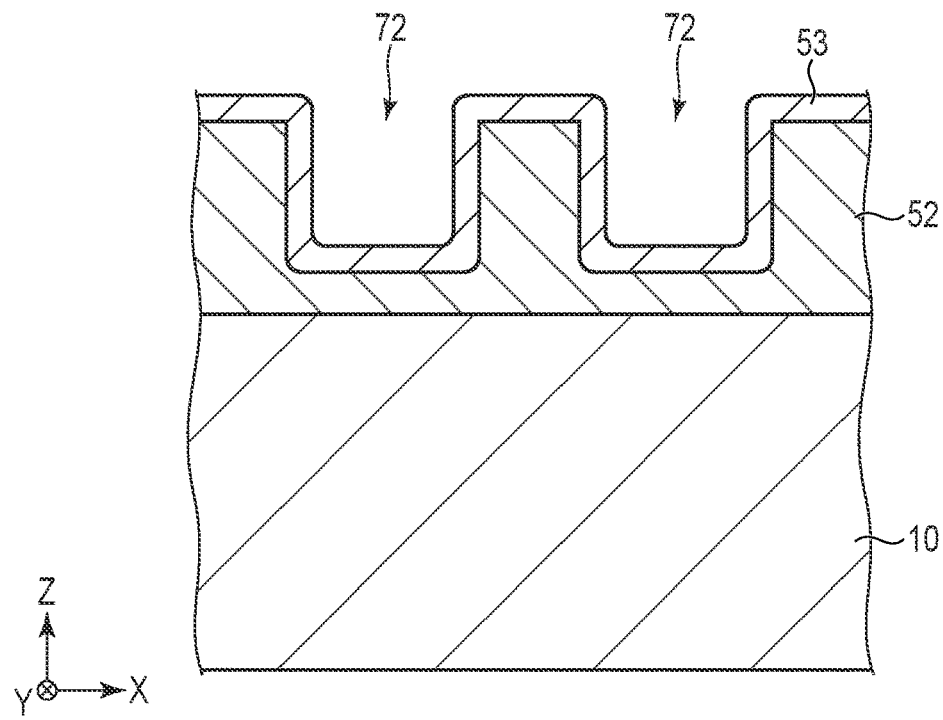
Figure 10B:
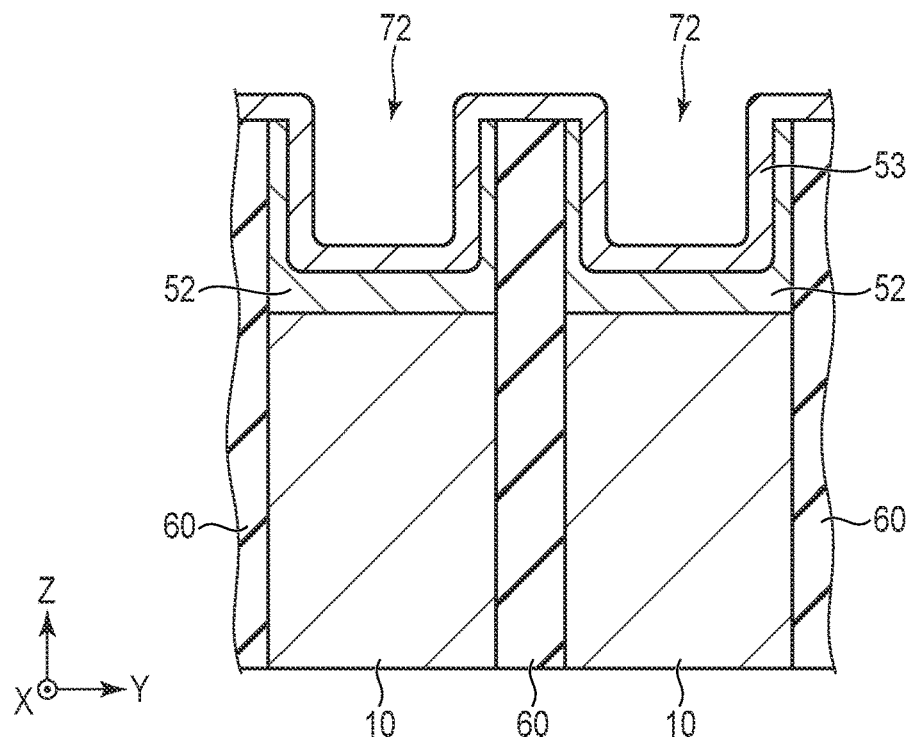

Next, as illustrated in FIGS. 10A and 10B, the selector material layer 53 is formed after the mask pattern 71 is removed. For example, the selector material layer 53 is formed by atomic layer deposition (ALD). Pulsed laser deposition (PLD), plasma chemical vapor deposition (CVD), or the like can also be used. Since the selector material layer 53 is formed along an inner surface of the trench 72, the selector material layer 53 has a recess. In addition, the corner of the recess of the selector material layer 53 is rounded. That is, the lower corner and the upper corner of the recess of the selector material layer 53 are rounded.

Next, as illustrated on FIGS. 11A and 11B, a conductive layer for the first electrode 51 of the selector 50 is formed on the structure obtained in the step of FIGS. 10A and 10B.

Figure 12A:
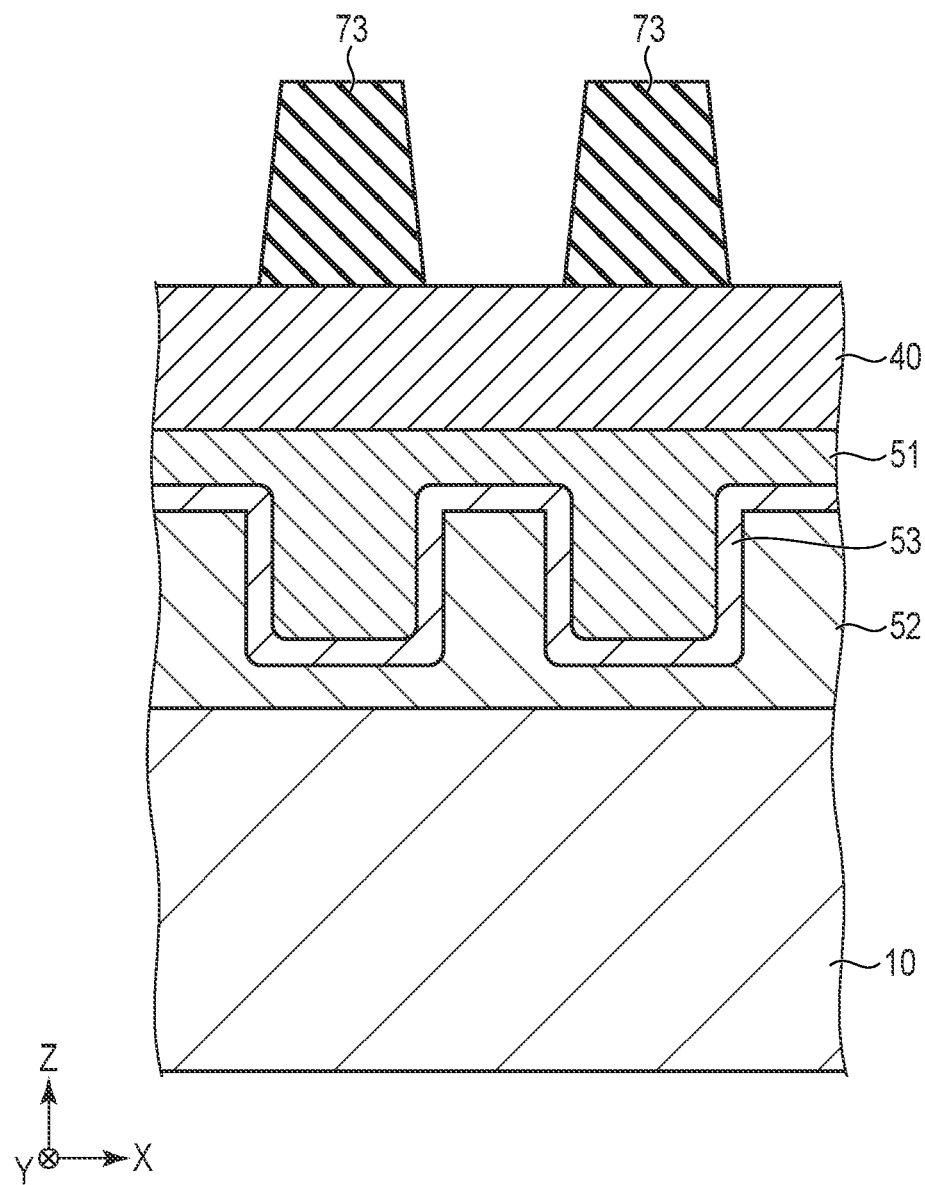
Figure 12B:
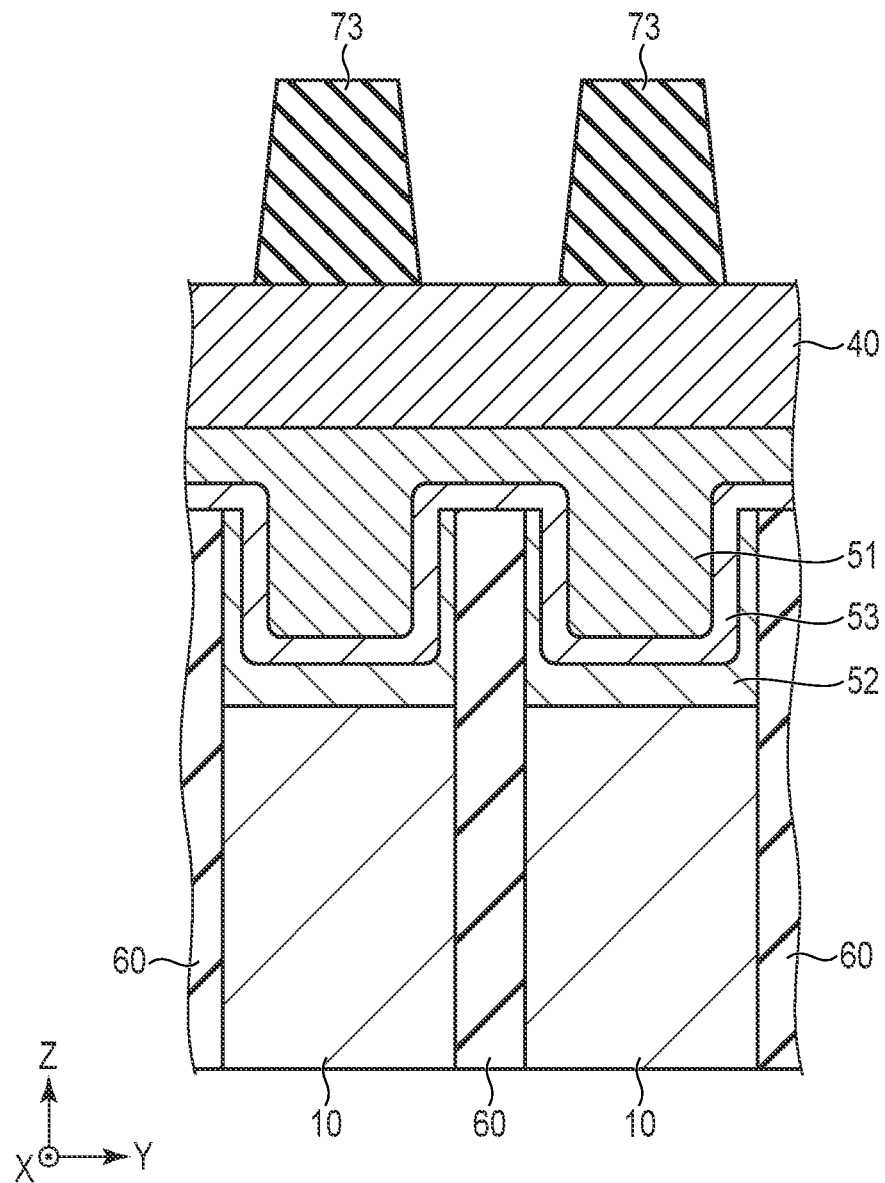

Next, as illustrated in FIGS. 12A and 12B, a layer for the magnetoresistance effect element 40 is formed on the structure obtained in the step of FIGS. 11A and 11B. That is, the storage layer 41, the reference layer 42, and the tunnel barrier layer 13 illustrated in FIG. 2 are formed as layers for the magnetoresistance effect element 40. Subsequently, a conductive mask pattern 73 is formed on the layer for the magnetoresistance effect element 40.

Figure 13A:
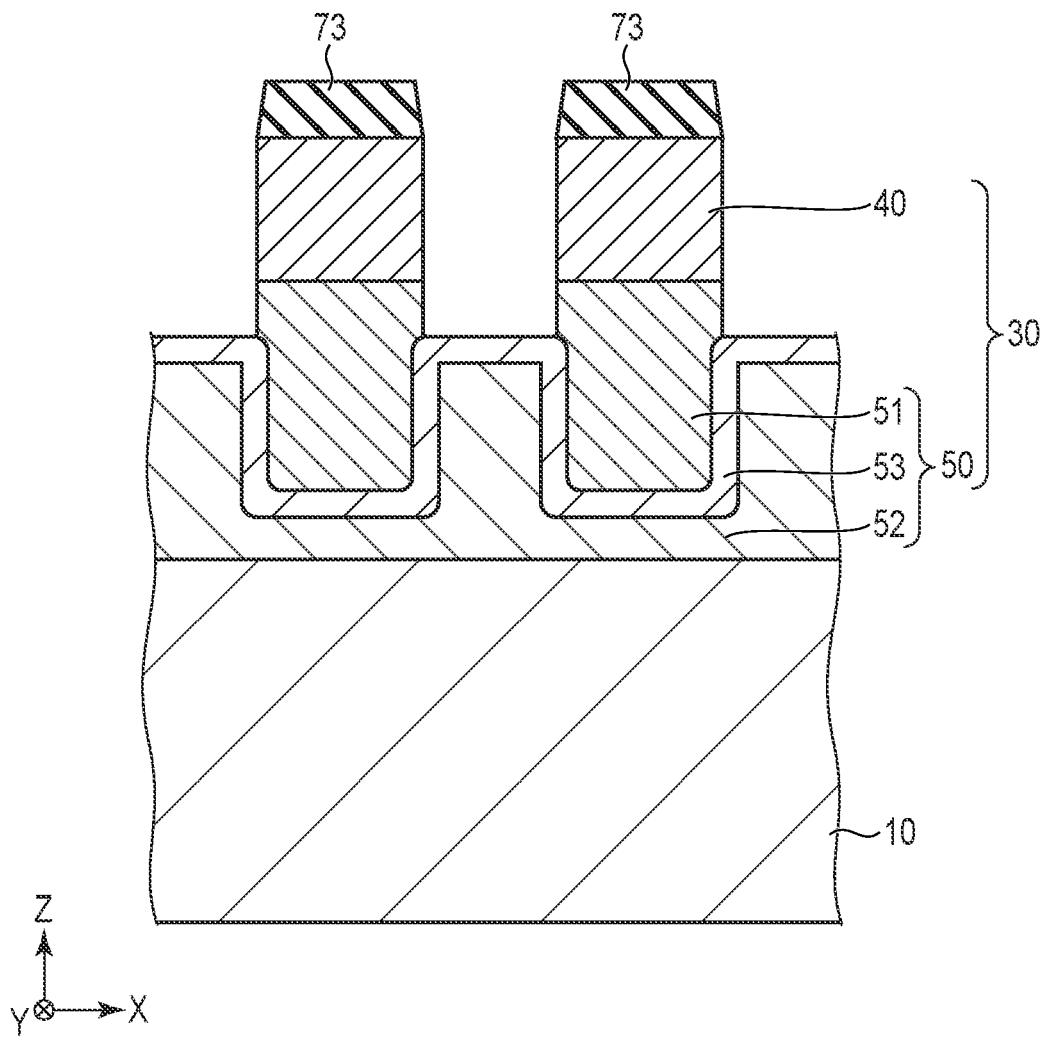
Figure 13B:
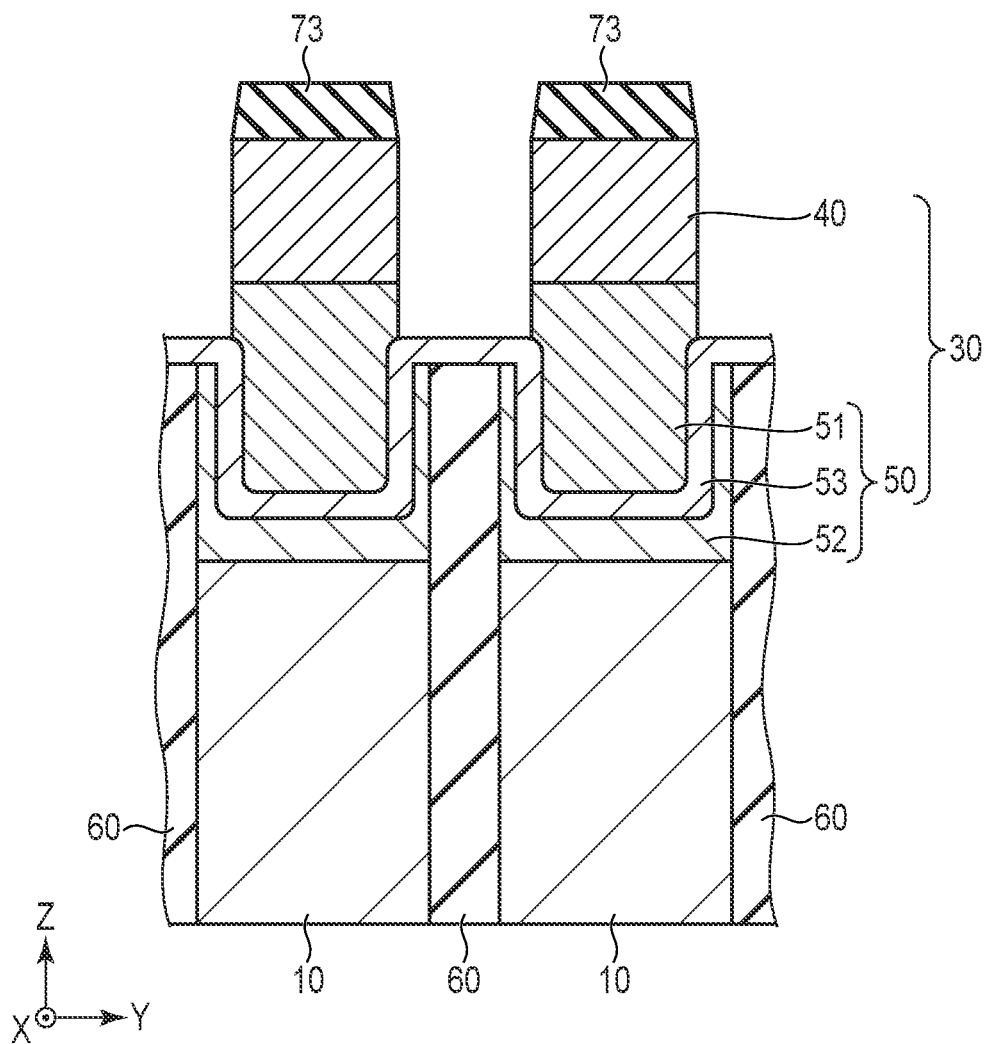

Next, as illustrated in FIGS. 13A and 13B, the layer for the magnetoresistance effect element 40 and the conductive layer for the first electrode 51 are etched using the mask pattern 73 as a mask. As a result, the memory cell 30 including the magnetoresistance effect element 40 and the selector 50 is formed.

Figure 14A:
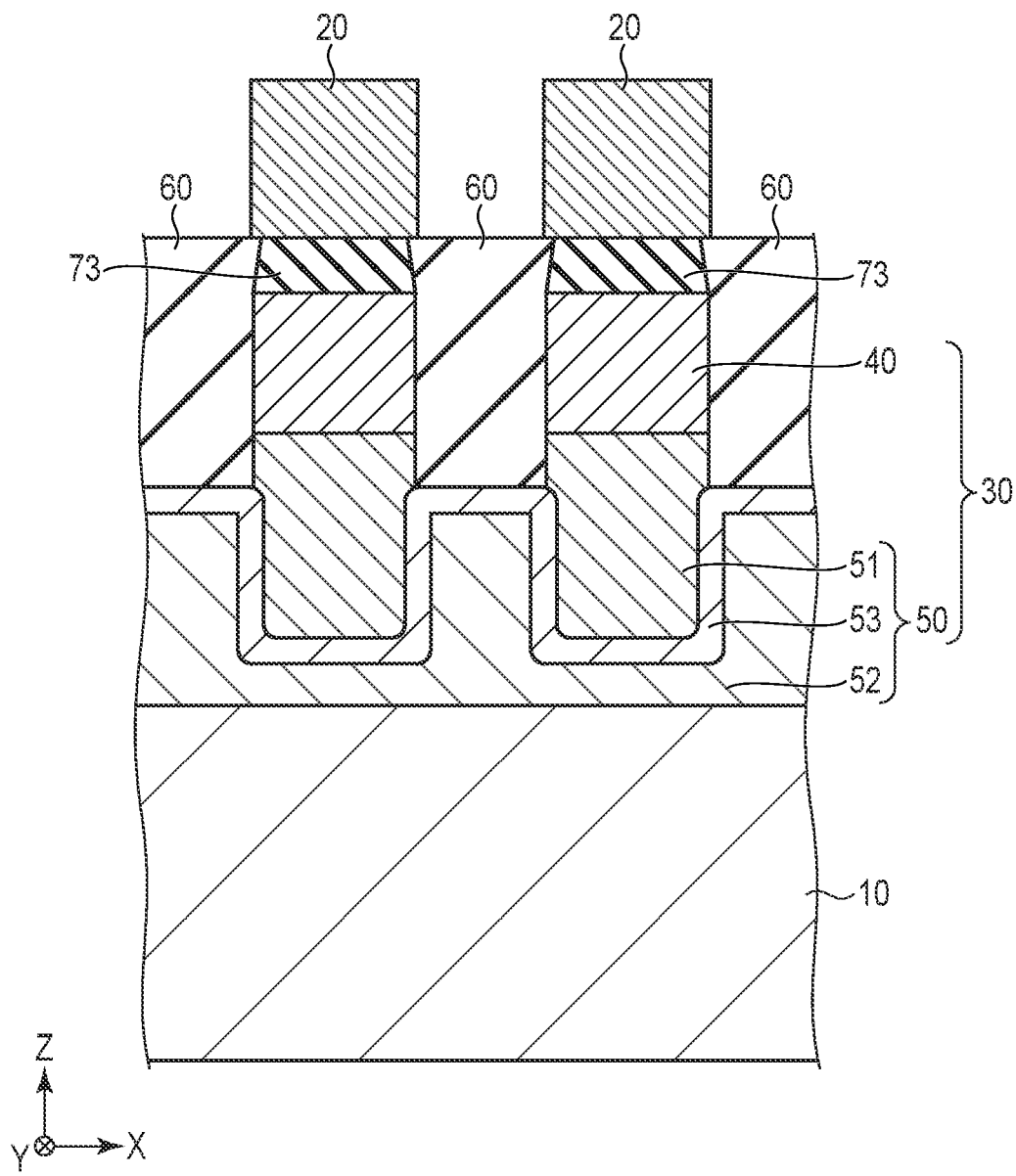
Figure 14B:
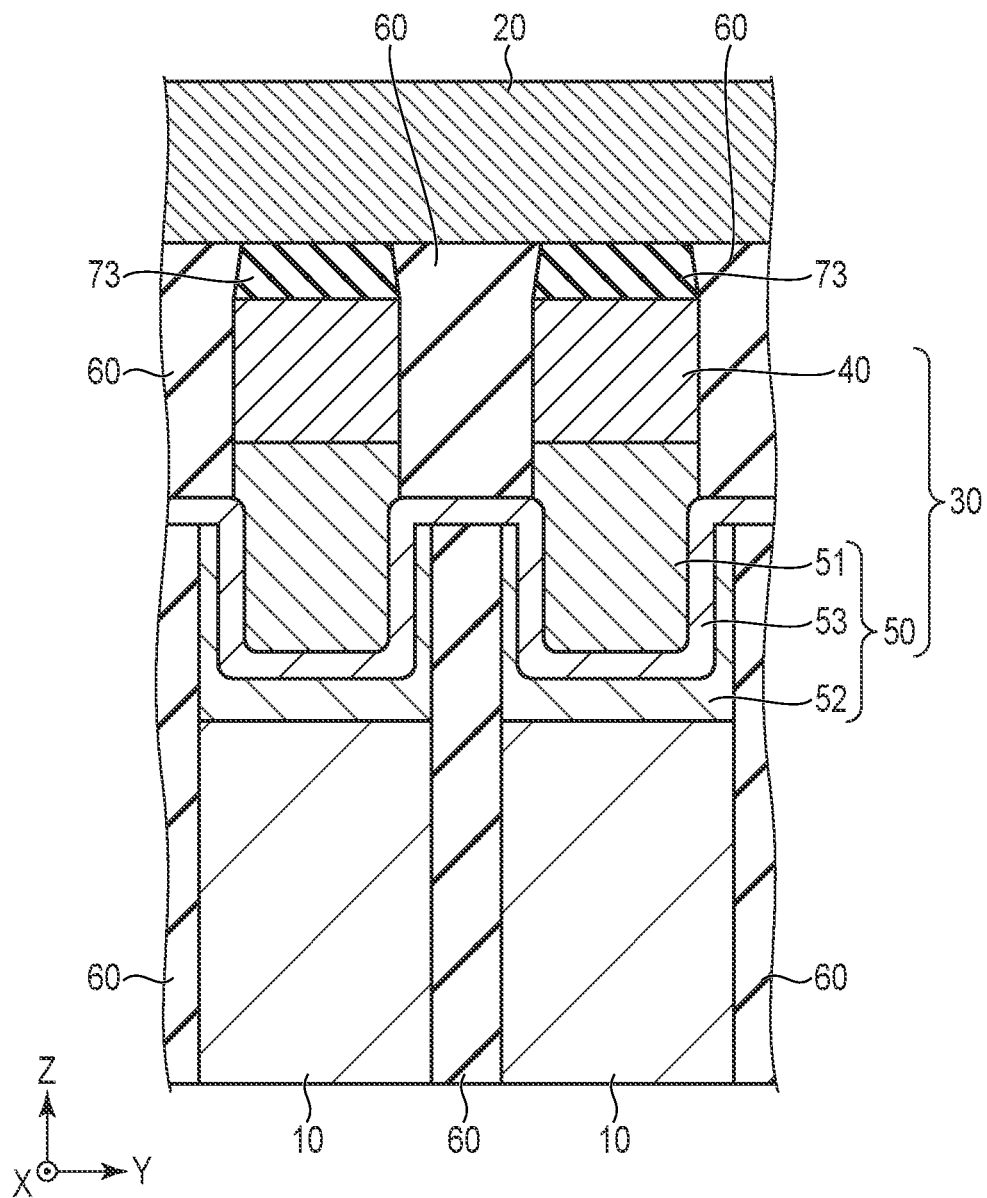

Next, as illustrated in FIGS. 14A and 14B, the region between the memory cells 30 is filled with an interlayer insulating film 60. Further, the second wiring 20 extending in the Y direction is formed.

The basic structure of the present modification is similar to the structure of the above-described embodiment, and the same effect as the above-described embodiment can be obtained also in the present modification. Further, in the present modification, since the corner of the recess of the selector material lanai 53 is rounded, it is possible to suppress the concentration of the electric field on the corner portion.

FIGS. 15A and 15B to 22A and 22B are cross-sectional views schematically illustrating a configuration and a manufacturing method of a seventh modification of the memory device according to the present embodiment. FIGS. 15A to 22A are cross-sectional views parallel to the X direction, and FIGS. 15A to 22B are cross-sectional views parallel to the Y direction.

Figure 15A:
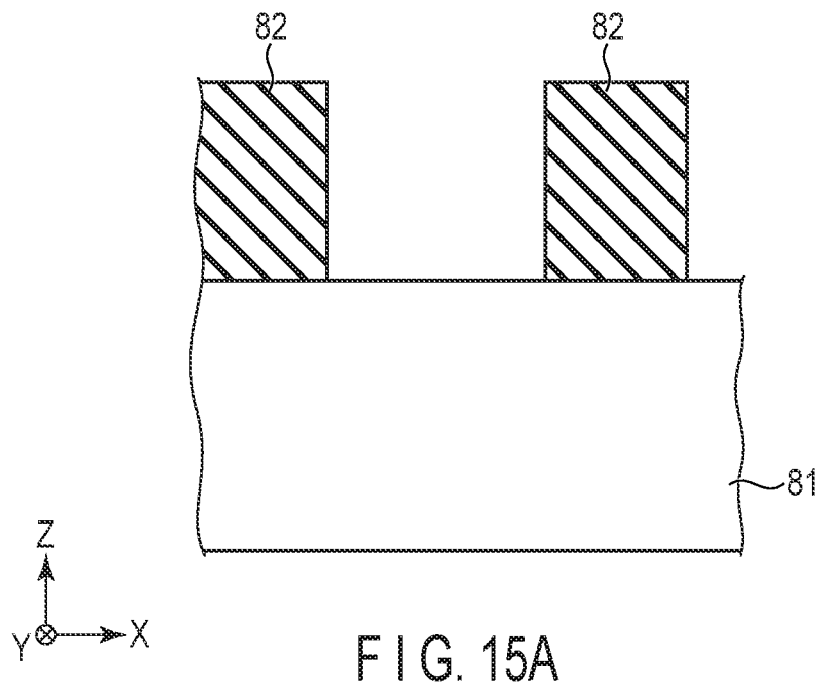
Figure 15B:
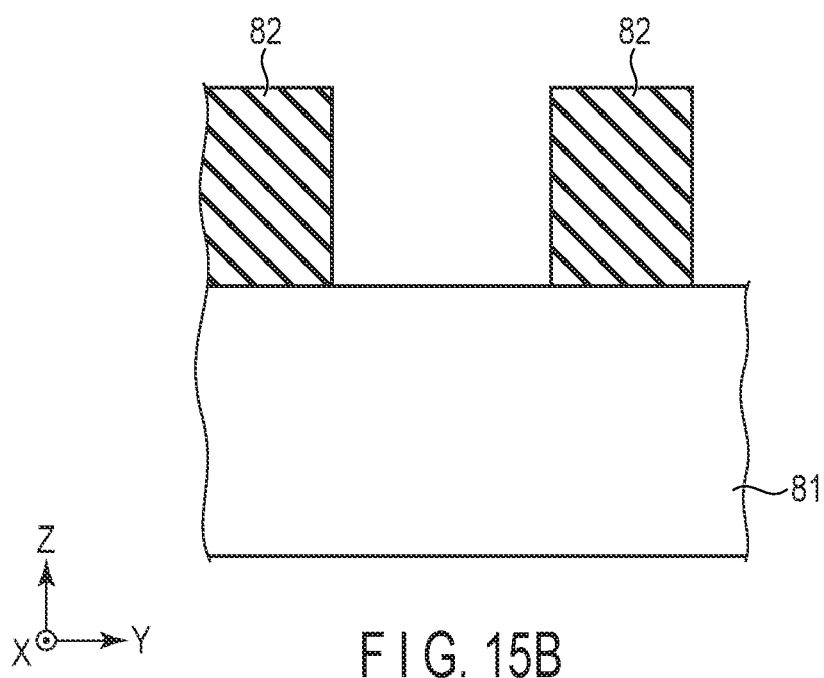

First, as illustrated in FIGS. 15A and 15B, a mask pattern 82 extending in the X direction and the Y direction is formed on a silicon substrate (semiconductor substrate) 81. As the silicon substrate 81, a single crystal silicon substrate having a (100) plane as a main surface is used.

Figure 16A:
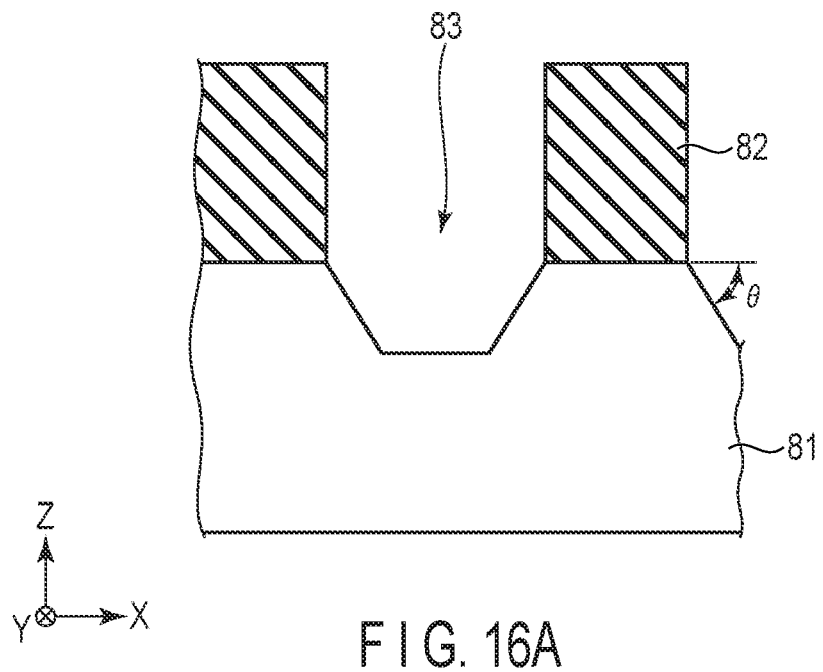
Figure 16B:
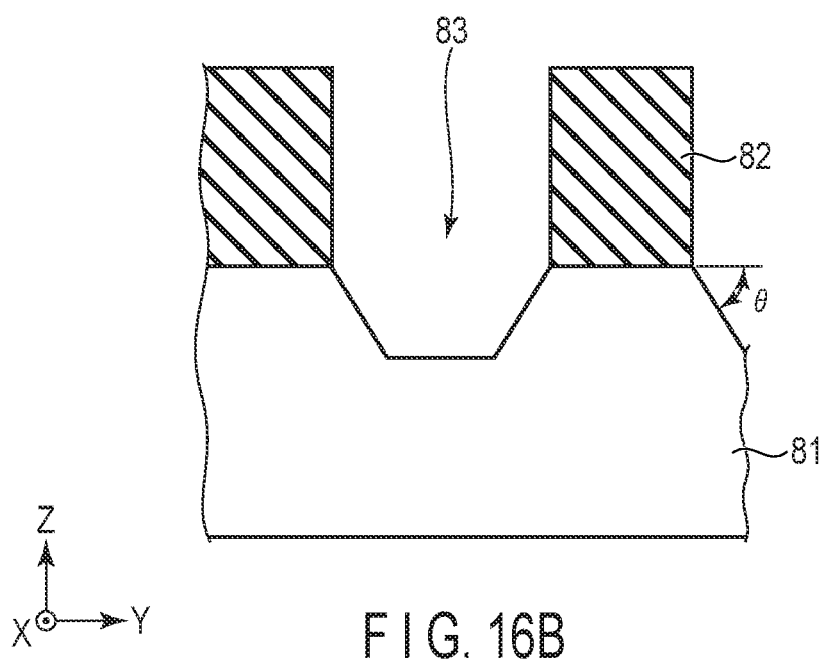

Next, as illustrated in FIGS. 16A and 16B, the silicon substrate 81 is etched using the mask pattern 82 as a mask to form a trench 83. By using the (100) substrate as the silicon substrate 81, the trench 83 having the inclined side surface informed. Specifically, an angle θ of the inclined surface illustrated in the drawing is 54.7°.

Next, as illustrated in FIGS. 17A and 17B, after the mask pattern 82 is removed, a conductive layer for the second electrode 52 of the selector 50 is formed. Note that the first wiring 10 may be provided between the second electrode 52 and the silicon substrate 81. Subsequently, a part of the conductive layer for the second electrode 52 and the silicon substrate 81 is etched to form a trench, and the formed trench is filled with the interlayer insulating film 60.

Figure 18A:
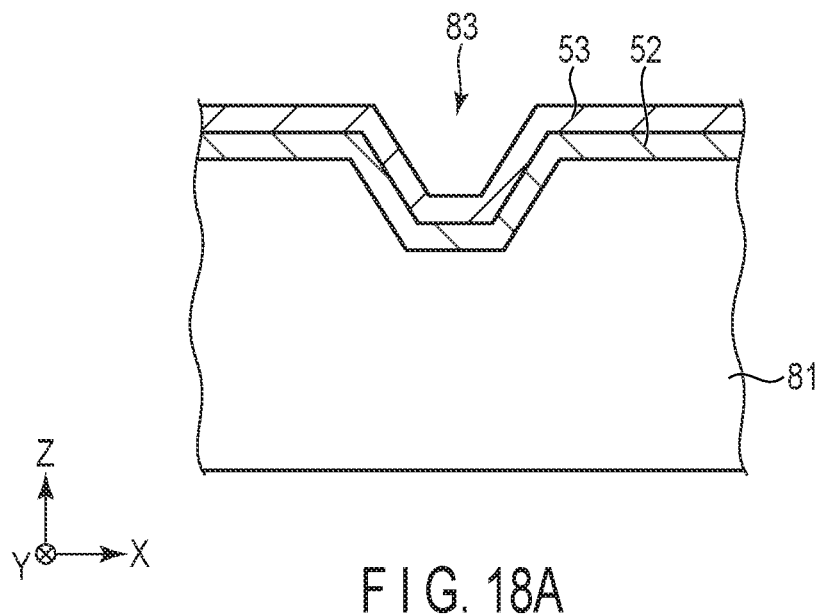
Figure 18B:
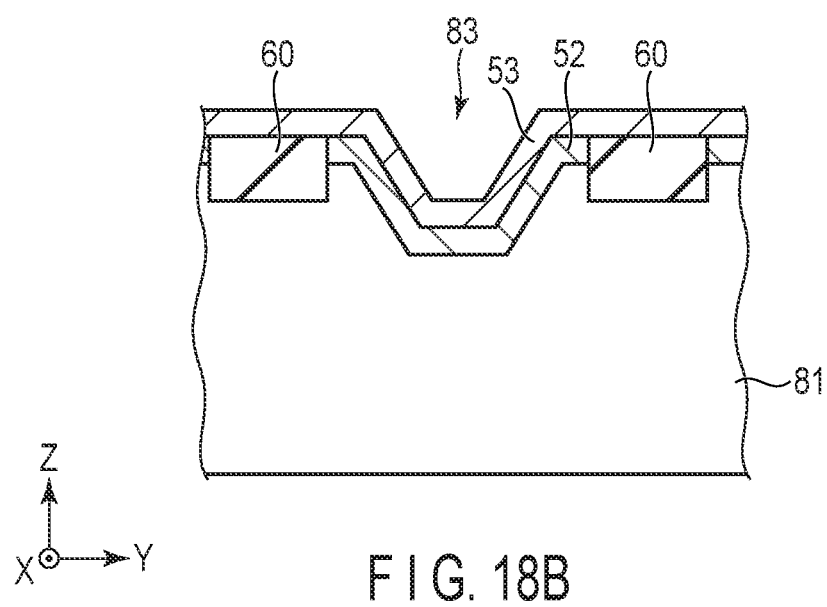

Next, as illustrated in FIGS. 18A and 18B, the selector material layer 53 is formed on the structure obtained in the step of FIGS. 17A and 17B by the ALD. Since the selector material layer 53 is formed along the inner surface of the trench 83, the selector material layer 53 has a recess, and the side surface of the recess of the selector material layer 53 is inclined.

Figure 19A:
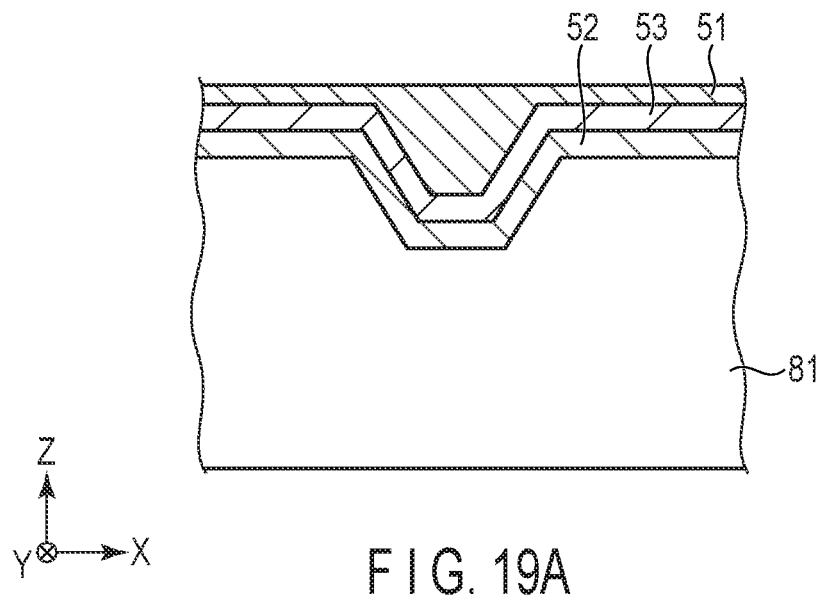
Figure 19B:
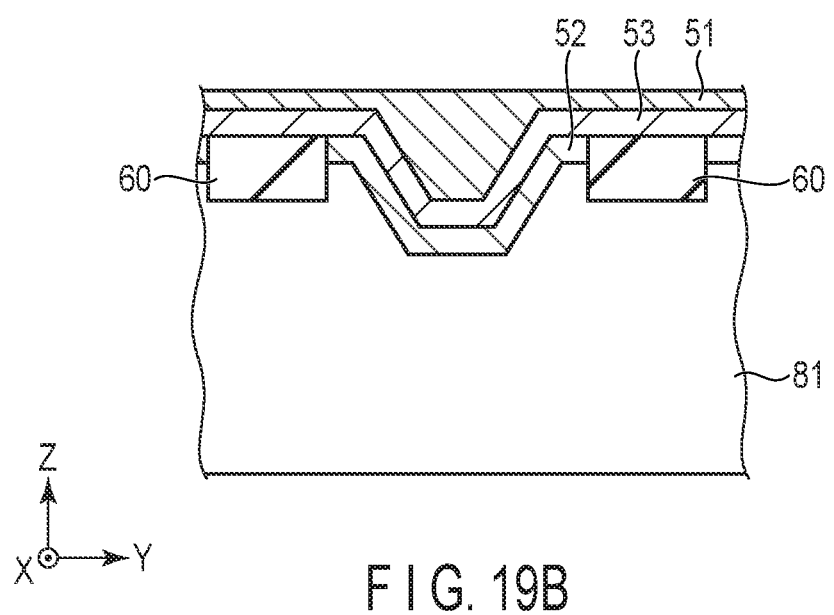

Next, as illustrated in FIGS. 19A and 19B, a conductive layer for the first electrode 51 of the selector 50 is formed on the structure obtained in the step of FIGS. 18A and 18B. Further, the conductive layer for the first electrode 51 is planarized by chemical mechanical polishing (CMP).

Figure 20A:
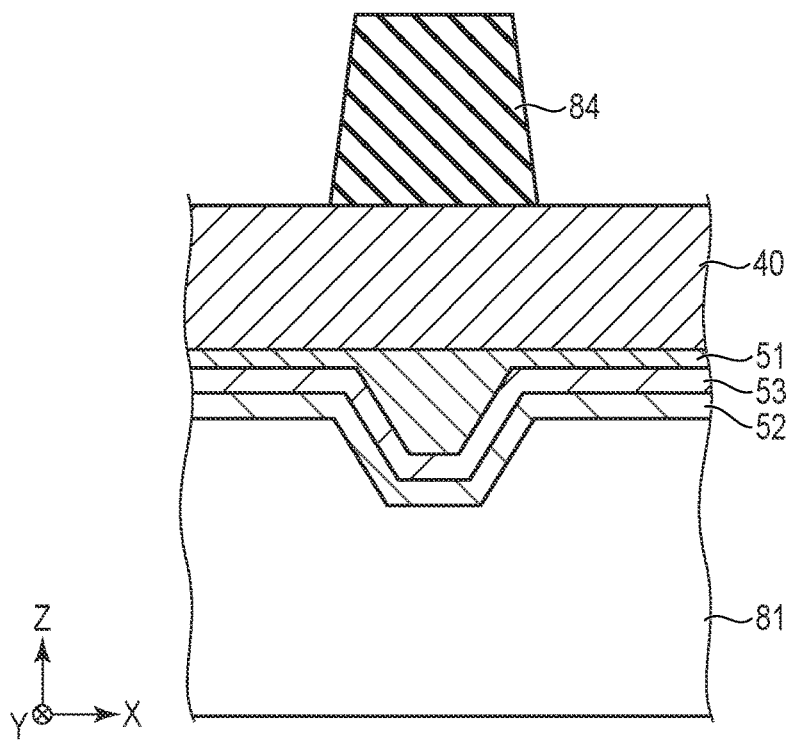
Figure 20B:
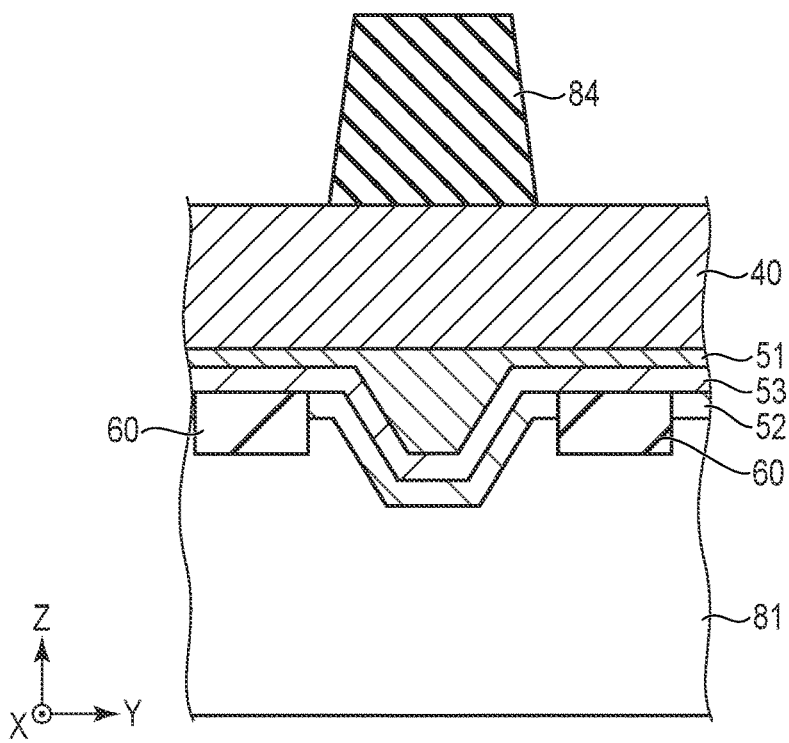

Next, as illustrated in FIGS. 20A and 20B, a layer for the magnetoresistance effect element 40 is formed on the structure obtained in the step of FIGS. 19A and 19B. That is, the storage layer 41, the reference layer 42, and the tunnel barrier layer 43 illustrated in FIG. 2 are formed as layers for the magnetoresistance effect element 40. Subsequently, a conductive mask pattern 84 informed on the layer for the magnetoresistance effect element 40.

Figure 21A:
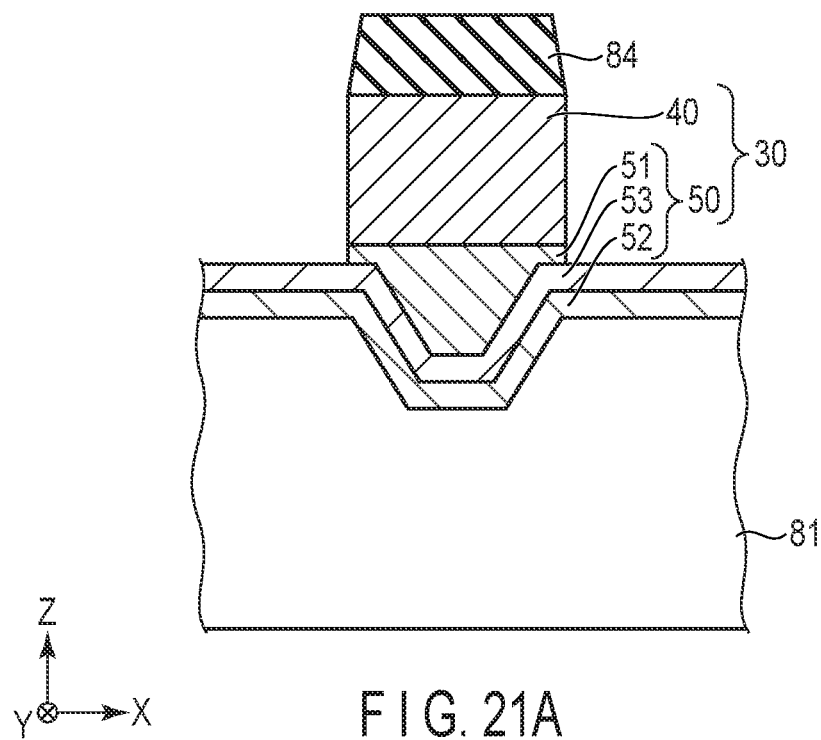
Figure 21B:
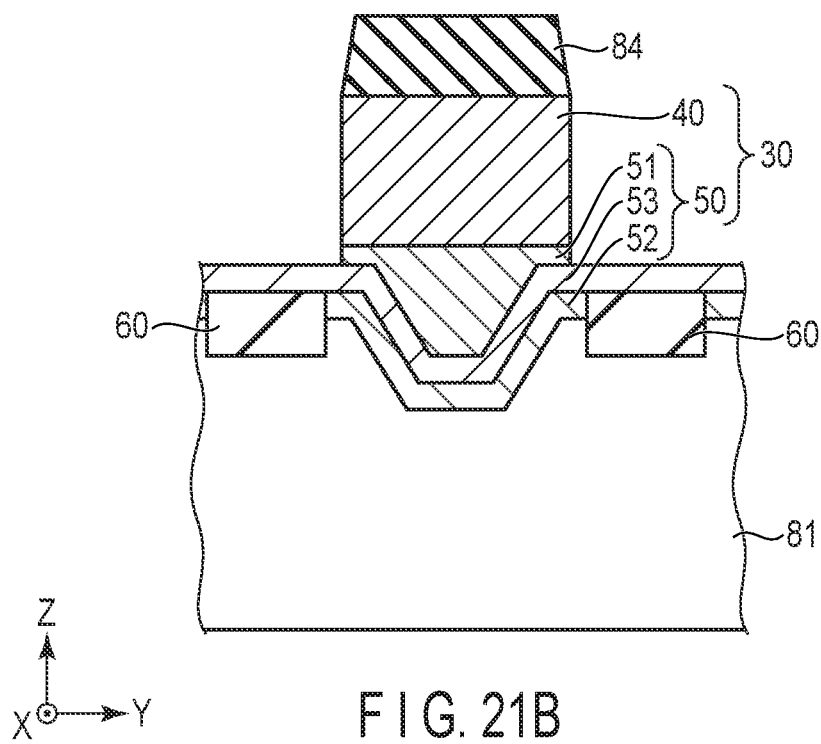

Next, as illustrated in FIGS. 21A and 21B, the layer for the magnetoresistance effect element 40 and the conductive layer for the first electrode 51 are etched using the mask pattern 84 as a mask. As a result, the memory cell 30 including the magnetoresistance effect element 40 and the selector 50 is formed.

Figure 22A:
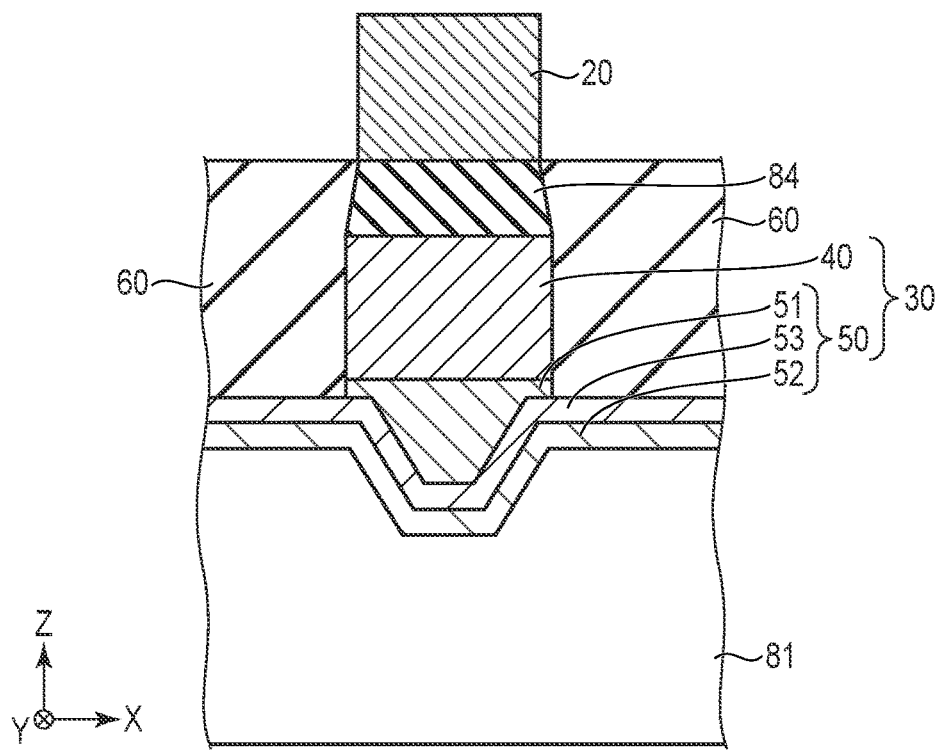
Figure 22B:
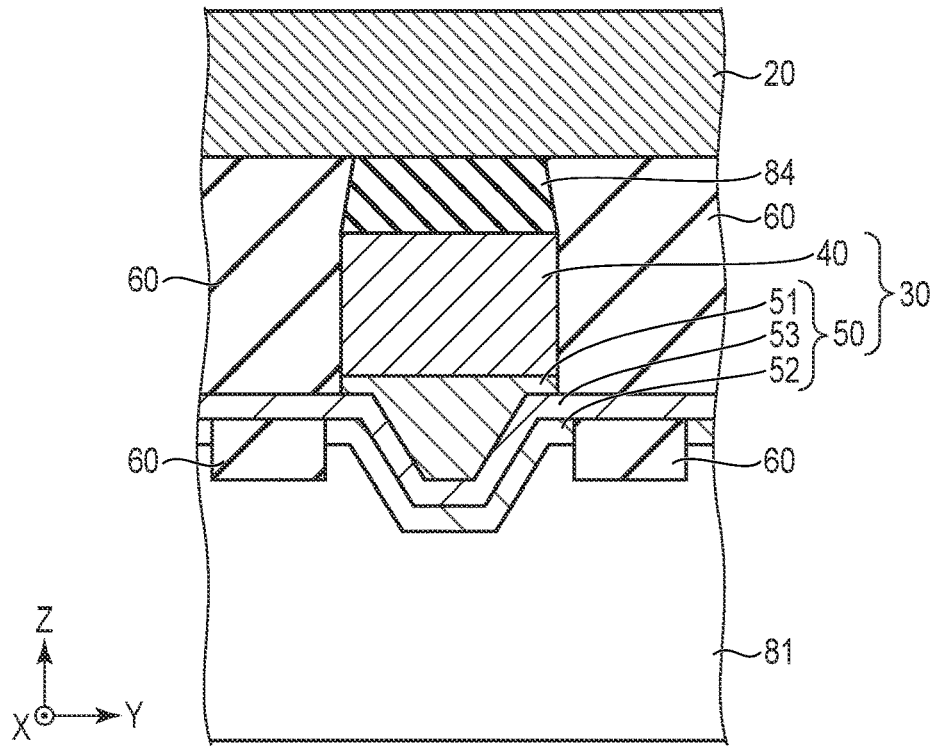

Next, as illustrated in FIGS. 22A and 22B, the region between the memory cells 30 is filled with an interlayer insulating film 60. Further, the second wiring 20 extending in the Y direction is formed.

The basic structure of the present modification is similar to the structure of the above-described embodiment, and the same effect as the above-described embodiment can be obtained also in the present modification. In addition, in the present modification, since the side surface of the recess of the selector material layer 53 is inclined, the angle of the corner portion of the selector material layer 53 larger than 90°, and it is possible to suppress the electric field concentration on the corner portion.

FIGS. 23A and 23B to 27A and 27B are cross-sectional views schematically illustrating a configuration and a manufacturing method of an eighth modification of the memory device according to the present embodiment. FIGS. 23A to 27A are cross-sectional views parallel to the X direction, and FIGS. 23B to 27B are cross-sectional views parallel to the Y direction.

Figure 23A:
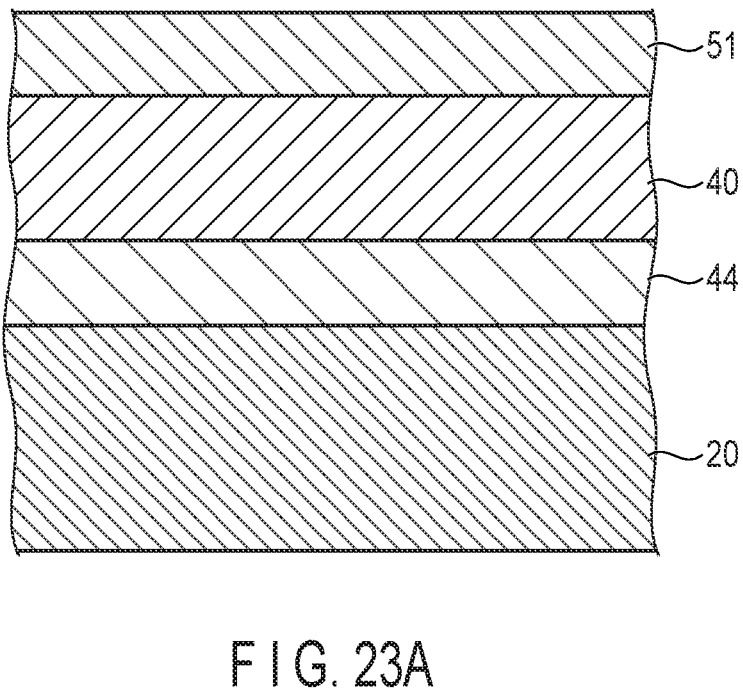
FIGS. 23A, 23B, 24A, 24B, 25A, 25B, 26A, 26B, 27A, and 27B are cross-sectional views schematically illustrating a configuration and a manufacturing method of an eighth modification of the memory device according to the first embodiment.
Figure 23B:
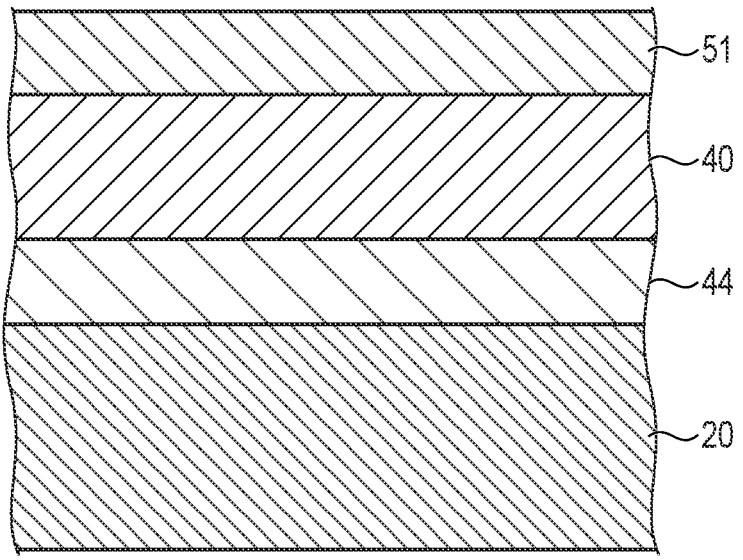

First, as illustrated in FIGS. 23A and 23B, the conductive layer for the second wiring 20 and the conductive layer for the bottom electrode 44 of the magnetoresistance effect element 40 are formed on a lower structure (not illustrated) including a semiconductor substrate (not illustrated). Subsequently, a layer for the magnetoresistance effect element 40 is formed on the conductive layer for the bottom electrode 44. That is, the storage layer 41, the reference layer 42, and the tunnel barrier layer 43 illustrated in FIG. 2 are formed as layers for the magnetoresistance effect element 40. Further, the conductive layer for the first electrode 51 of the selector 50 is formed on the layer for the magnetoresistance effect element 40.

Figure 24A:
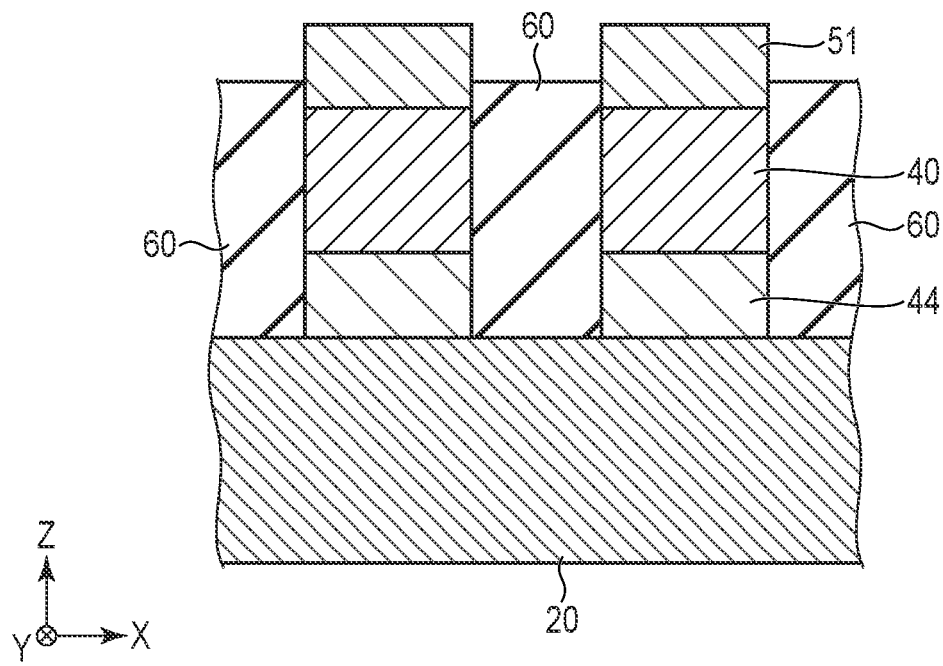
Figure 24B:
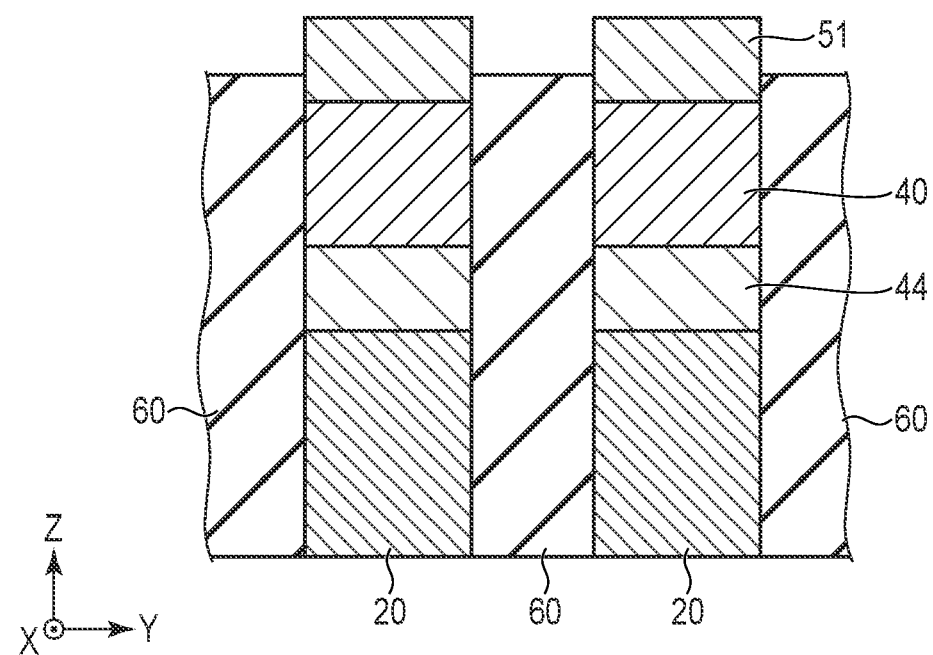

Next, as illustrated in FIGS. 24A and 24B, each layer formed in the step of FIGS. 23A and 23B is patterned to form a trench, and the interlayer insulating film 60 is formed in the trench. In this case, the upper surface of the interlayer insulating film 60 is positioned between the upper surface and the lower surface of the first electrode 51 of the selector 50.

Figure 25A:
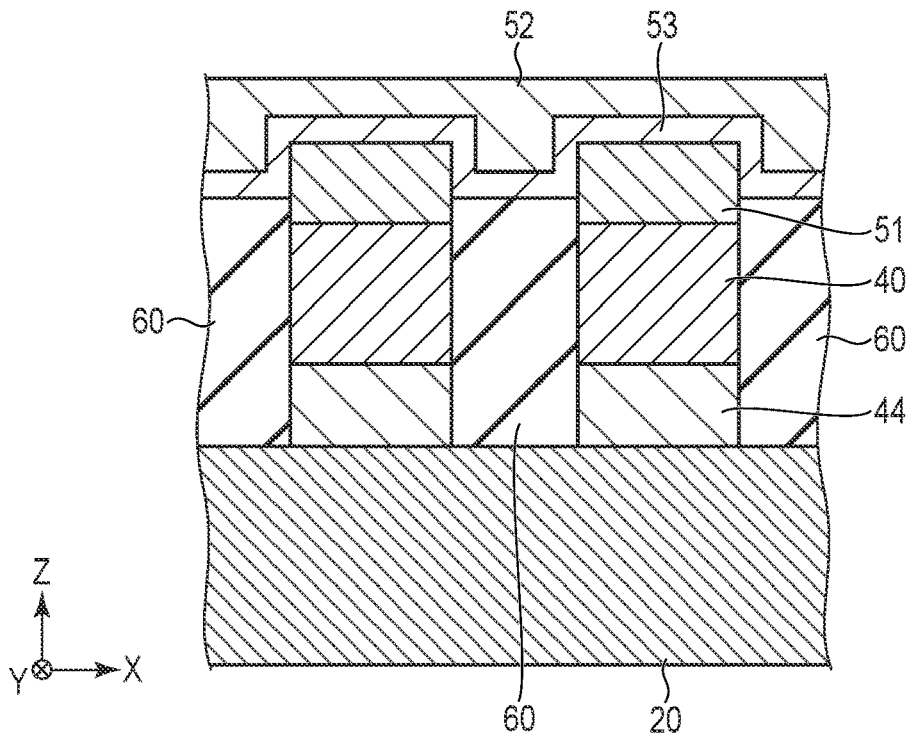
Figure 25B:
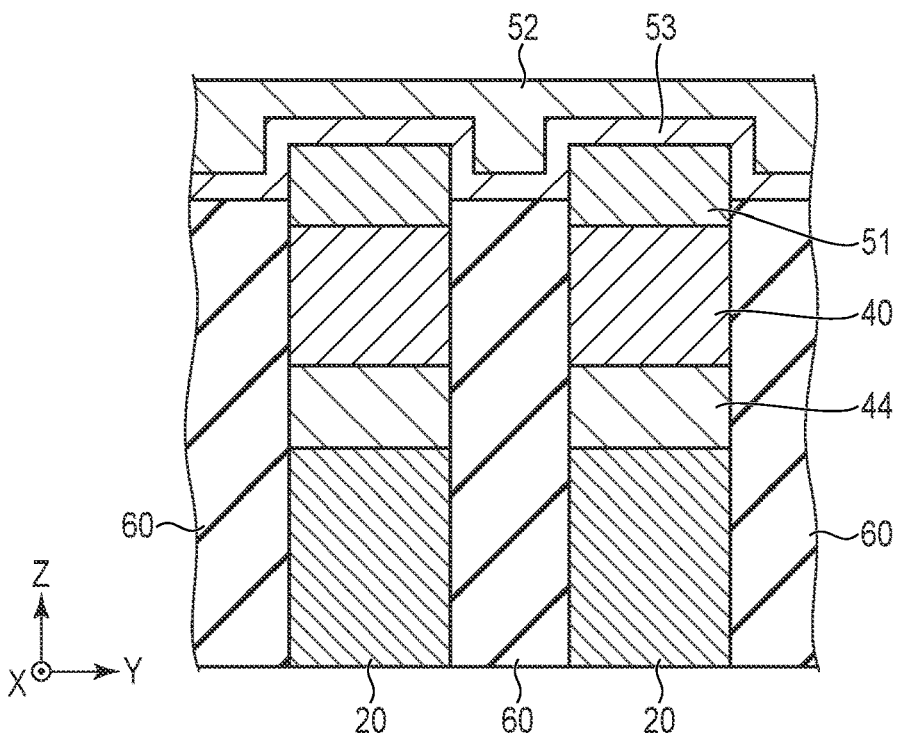

Next, as illustrated in FIGS. 25A and 25B, the selector material layer 53 is formed by the ALD, and the conductive layer for the second electrode 52 of the selector 50 is formed by the ALD.

Figure 26A:
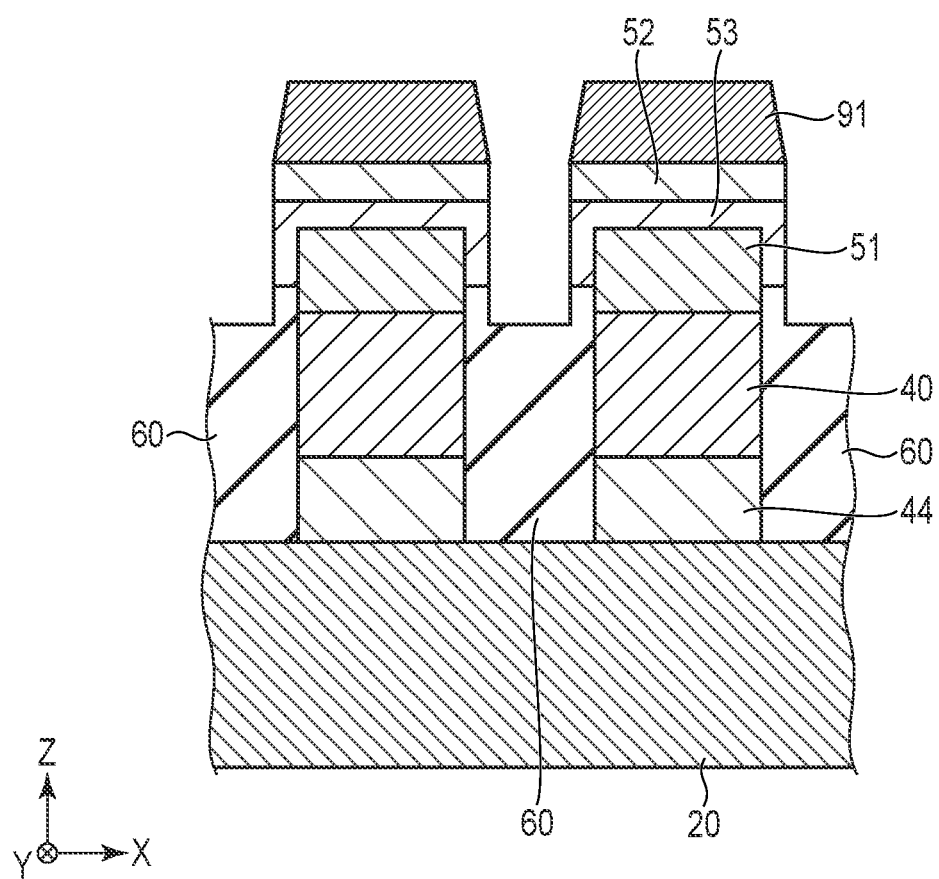
Figure 26B:
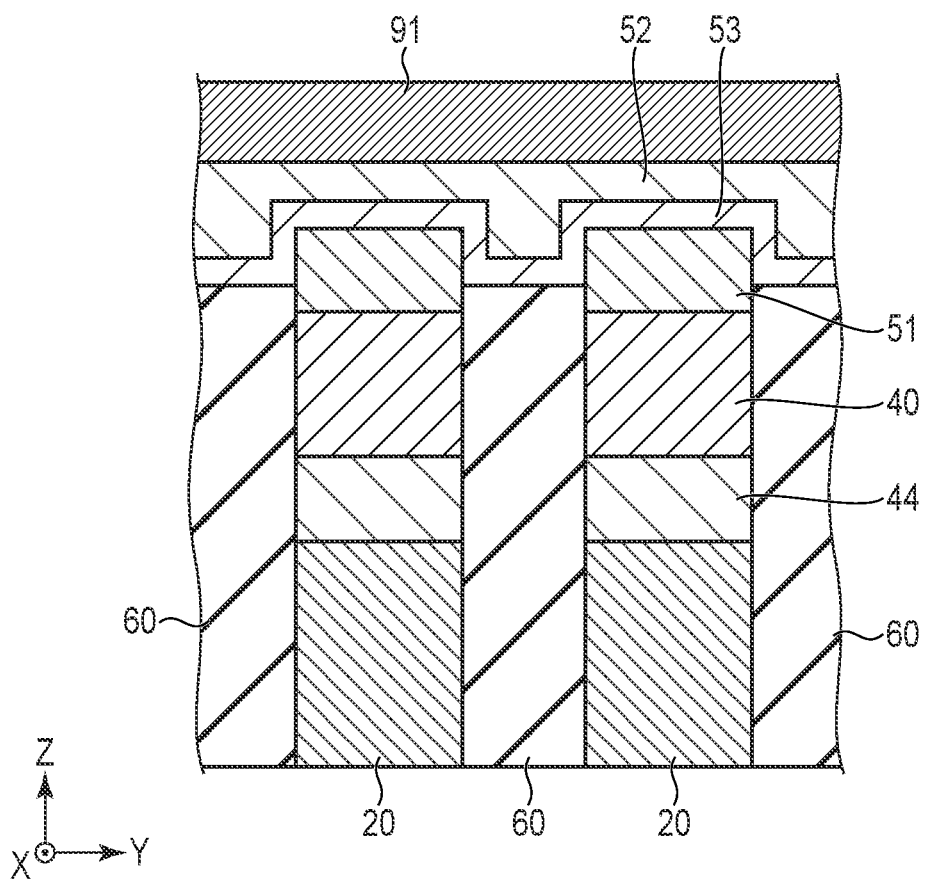

Next, as illustrated in FIGS. 26A and 26B, a conductive mask pattern 91 is formed on the conductive layer for the second electrode 52. Further, the etching is performed using the mask pattern 91 as the mask to form the patterns of the second electrode 52 of the selector 50 and the selector material layer 53.

Figure 27A:
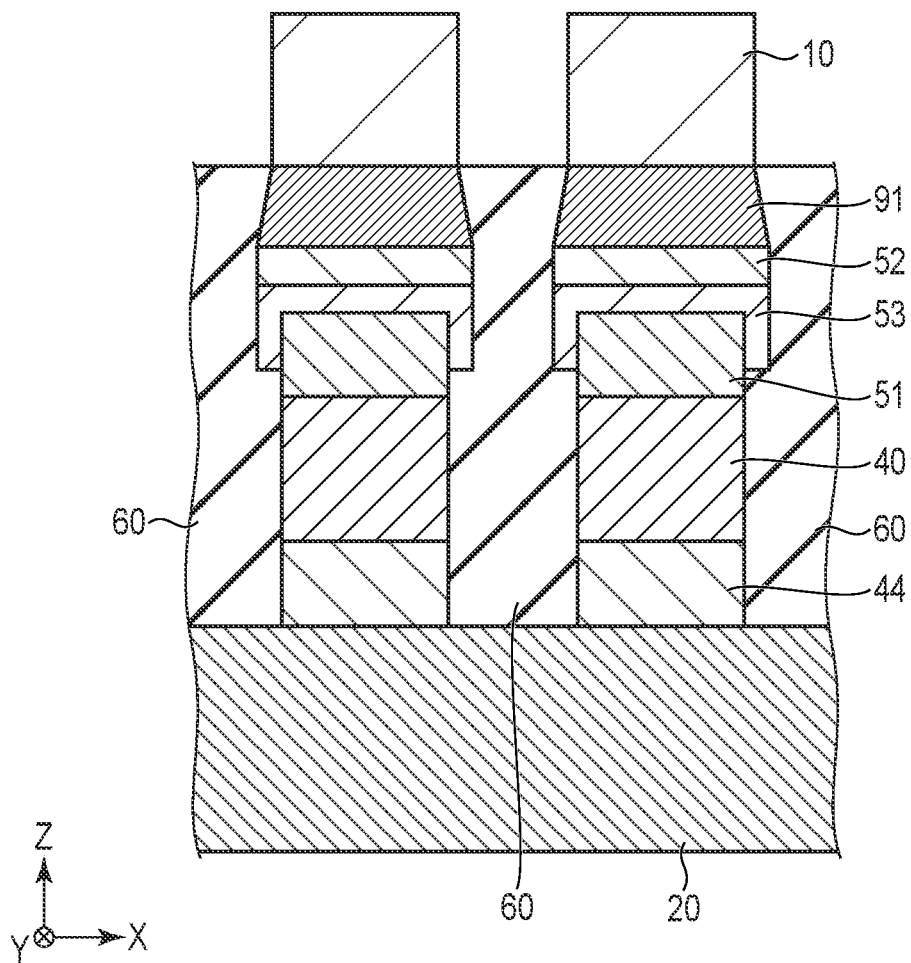
Figure 27B:
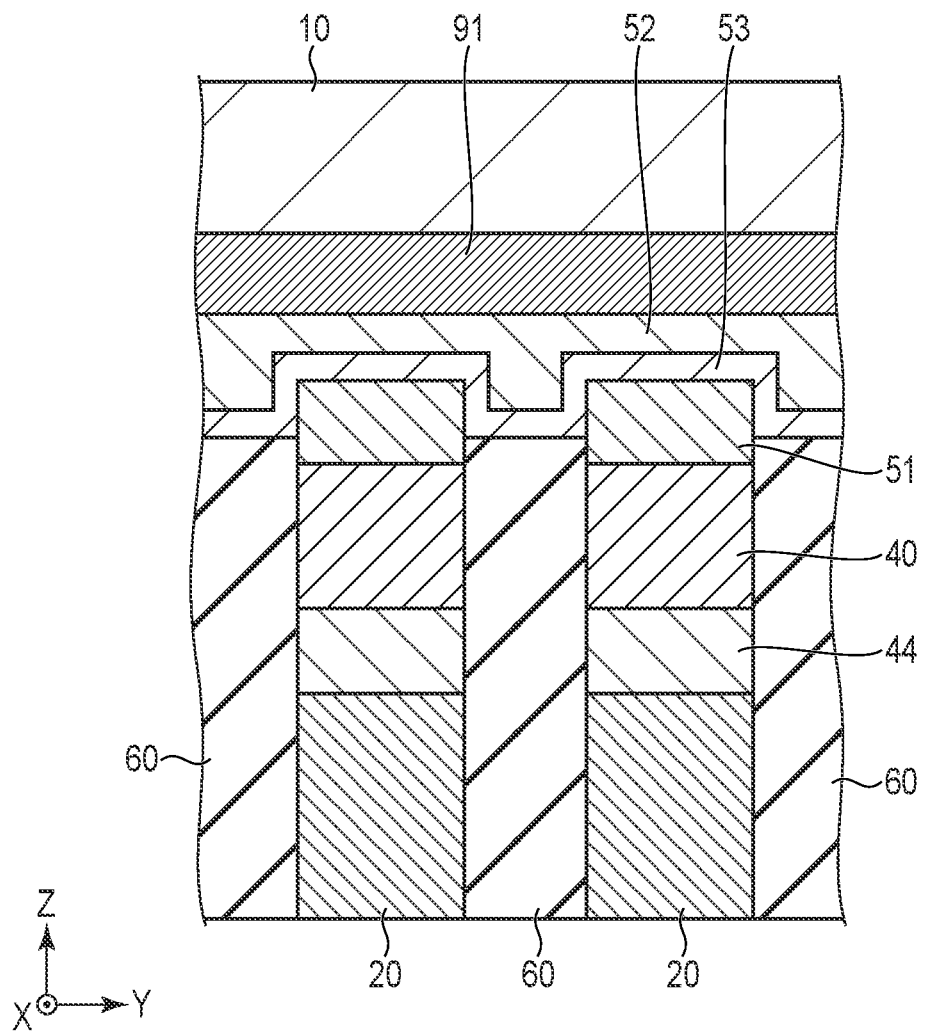

Next, as illustrated in FIGS. 27A and 27B, a region between the selectors 50 and a region between the mask patterns 91 are filled with the interlayer insulating film 60, and the first wiring 10 extending in the Y direction is further formed.

The basic structure of the present modification is also similar to the structure of the above-described embodiment, and the same effect as the above-described embodiment can be obtained also in the present modification.

Second Embodiment

Next, a second embodiment will be described. Note that basic matters are similar to those of the first embodiment, and description of matters described in the first embodiment will be omitted.

Figure 28B:
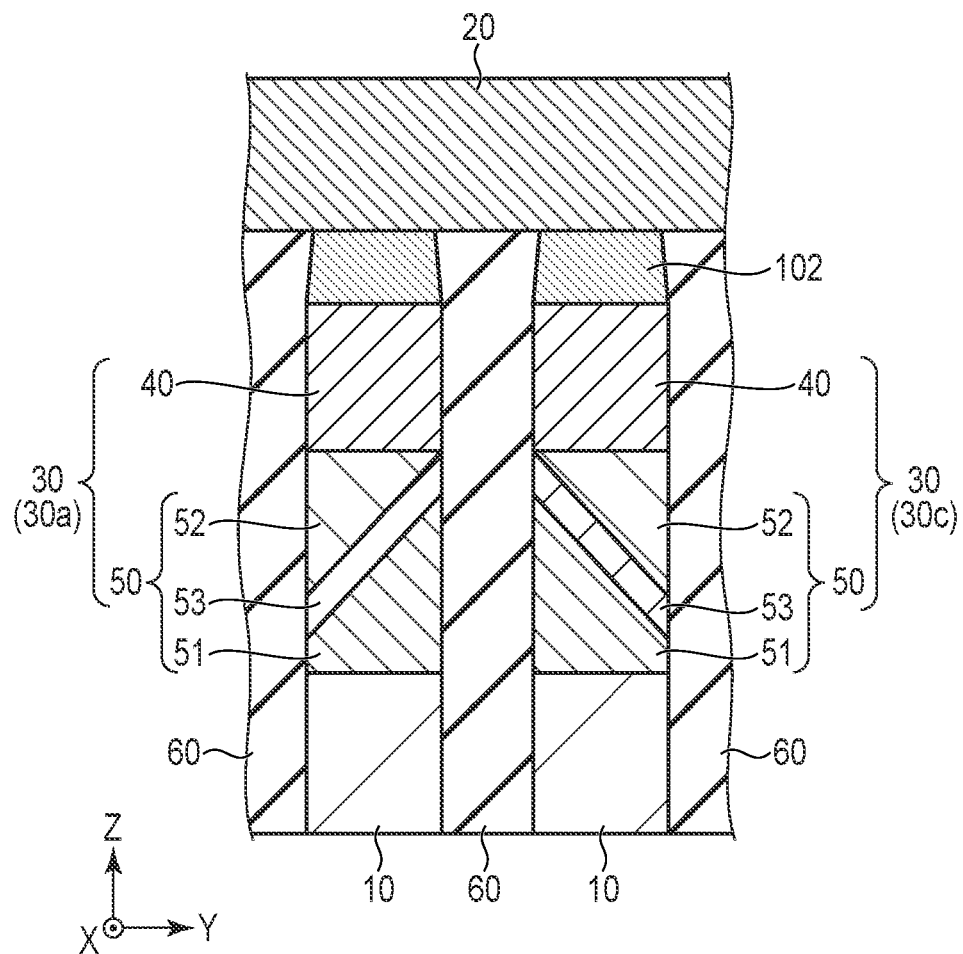

FIGS. 28A and 28B each are cross-sectional views schematically illustrating a configuration of a nonvolatile memory device according to a second embodiment. FIG. 28A is a cross-sectional view parallel to an X direction, and FIG. 28B is a cross-sectional view parallel to a Y direction.

Also in the present embodiment, similarly to the first embodiment, memory cells 30 adjacent in the X direction are defined as a first memory cell 30a and a second memory cell 30b, and memory cells 30 adjacent in the Y direction are defined as the first memory cell 30a and a third memory cell 30c.

When defined as described above, a selector material layer (switching material layer) 53 of the selector (switching element) 50 included in each of the first memory cell 30a, the second memory cell 30b, and the third memory cell 30c is inclined with respect to a plane perpendicular to a direction in which the magnetoresistance effect element (resistance change memory elements) 40 and the selector 50 are arranged. In other words, the selector materiel layer 53 of the selector 50 included in each of the first memory cell 30a, the second memory cell 30b, and the third memory cell 30c is inclined with respect to a plane parallel to a boundary surface between the magnetoresistance effect element 40 and the selector 50. Specifically, the selector material layer 53 is inclined as viewed from either the X direction or the Y direction.

In addition, the selector material layer 53 of the selector 50 included the first memory cell 30a and the selector material layer 53 of the selector 50 included in the second memory cell 30b are inclined in opposite directions to each other. Similarly, the selector material layer 53 of the selector 50 included in the first memory cell 30a and the selector materiel layer 53 of the selector 50 included in she third memory cell 30c are inclined in opposite directions to each other.

As described above, in the present embodiment, the selector material layer 53 is inclined. Therefore, a cross-sectional area of a current pass between the first electrode 51 and the second electrode 52 can increase, and an on-current of the selector 50 can increase. As a result, the write current and the read current to and from the memory cell 30 can increase, and an excellent memory device cache obtained.

FIGS. 29A and 29B to 36A and 36B are cross-sectional views schematically illustrating a manufacturing method of a memory device according to the present embodiment. FIGS. 29A to 36A are cross-sectional views parallel to the X direction, and FIGS. 29B to 36B are cross-sectional views parallel to the Y direction.

First, as illustrated in FIGS. 29A and 29B, a conductive layer for first wiring 10 and a conductive layer for the first electrode 51 of the selector 50 are formed on a lower structure (not illustrated) including a semi conductor substrate (not illustrated). Subsequently, these conductive layers are patterned to form a trench, and the interlayer insulating film 60 is formed in the trench.

Figure 30A:
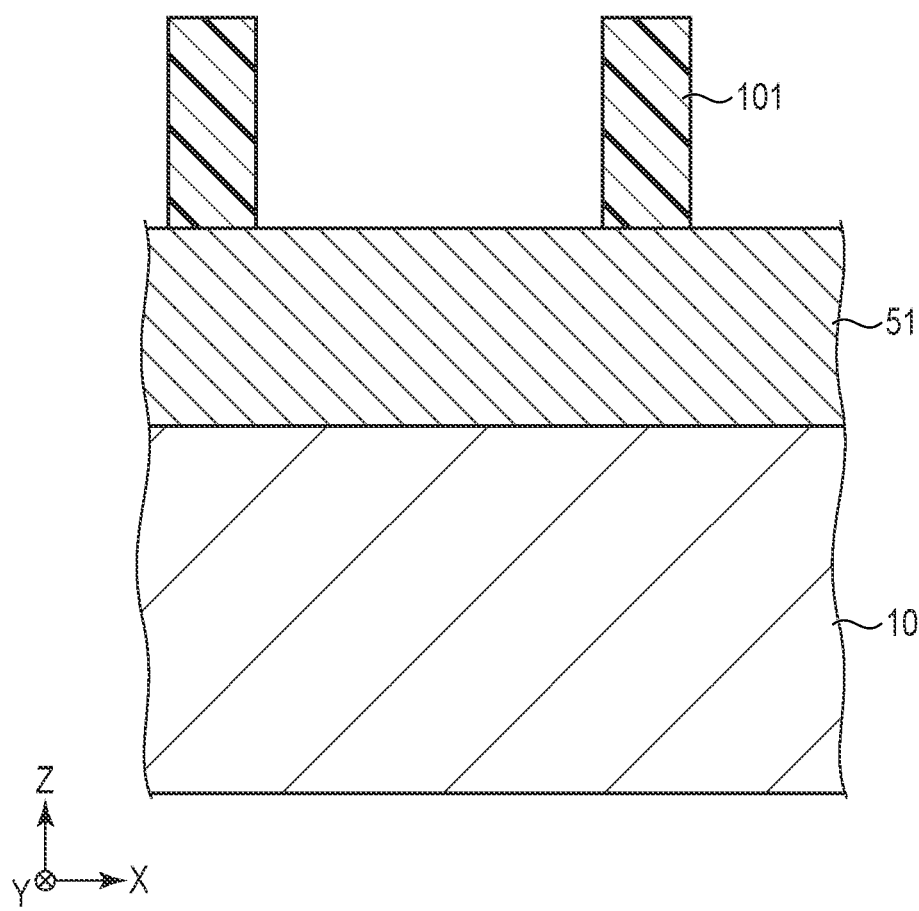

Next, as illustrated in FIGS. 30A and 30B, a resist pattern 101 is formed on the structure obtained in the step of FIGS. 29A and 29B.

Next, as illustrated in FIGS. 31A and 31B, the conductive layer for the first electrode 51 is etched using the resist pattern 101 as a mask. Specifically, dry etching is performed using a main etching gas and a mixed gas containing oxygen. As a result, inclined side surface (tapered side surface) is formed in the layer for the first electrode 51. The main etching gas contains argon (Ar) or the like.

Figure 32A:
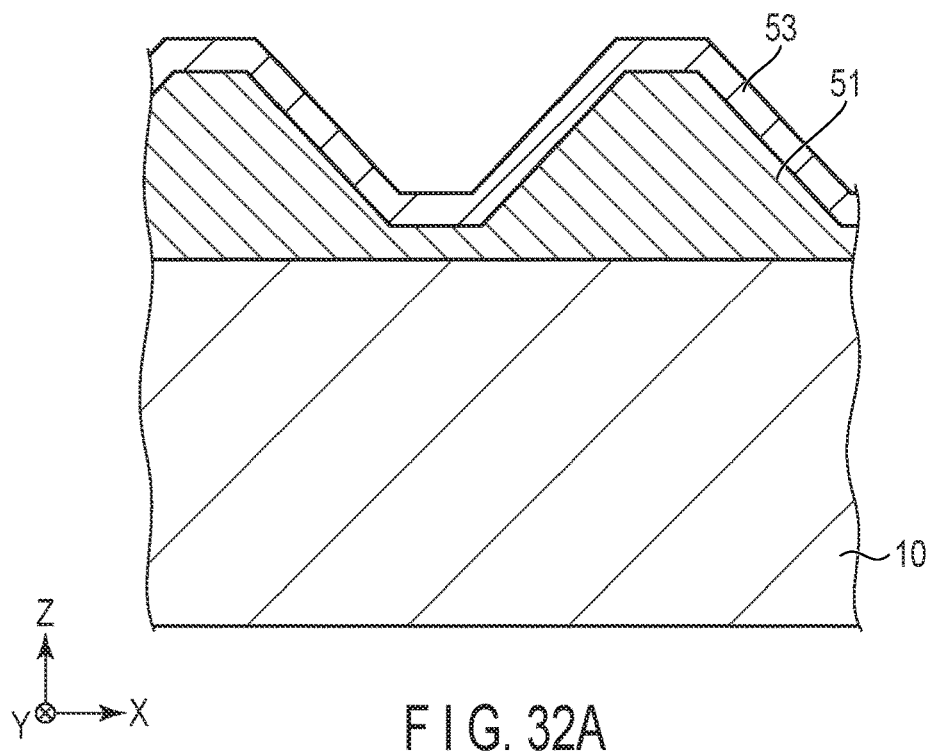
Figure 32B:
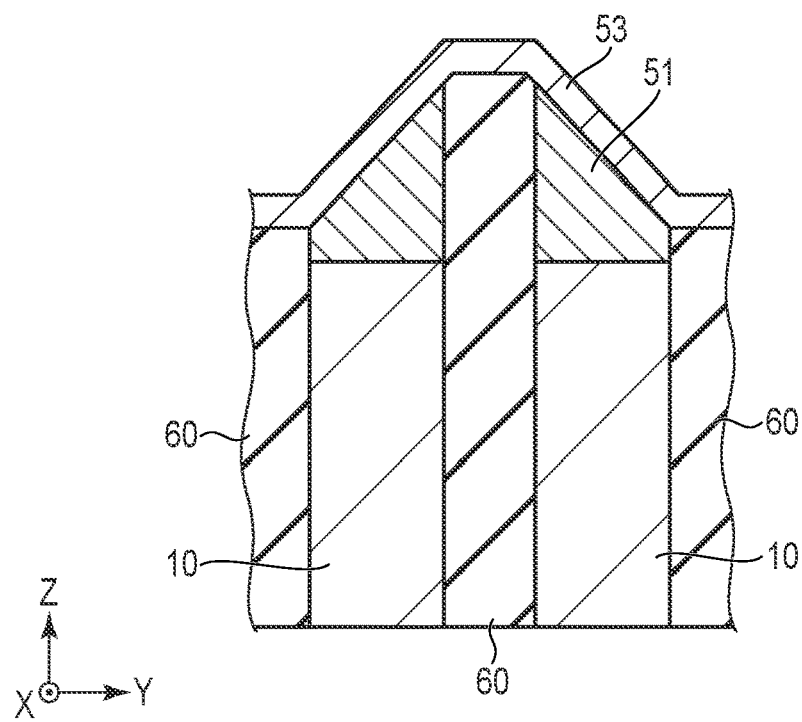

Next, as illustrated in FIGS. 32A and 32B, after the resist pattern 101 is removed, the selector material layer 53 is formed by the ALD.

Figure 33A:
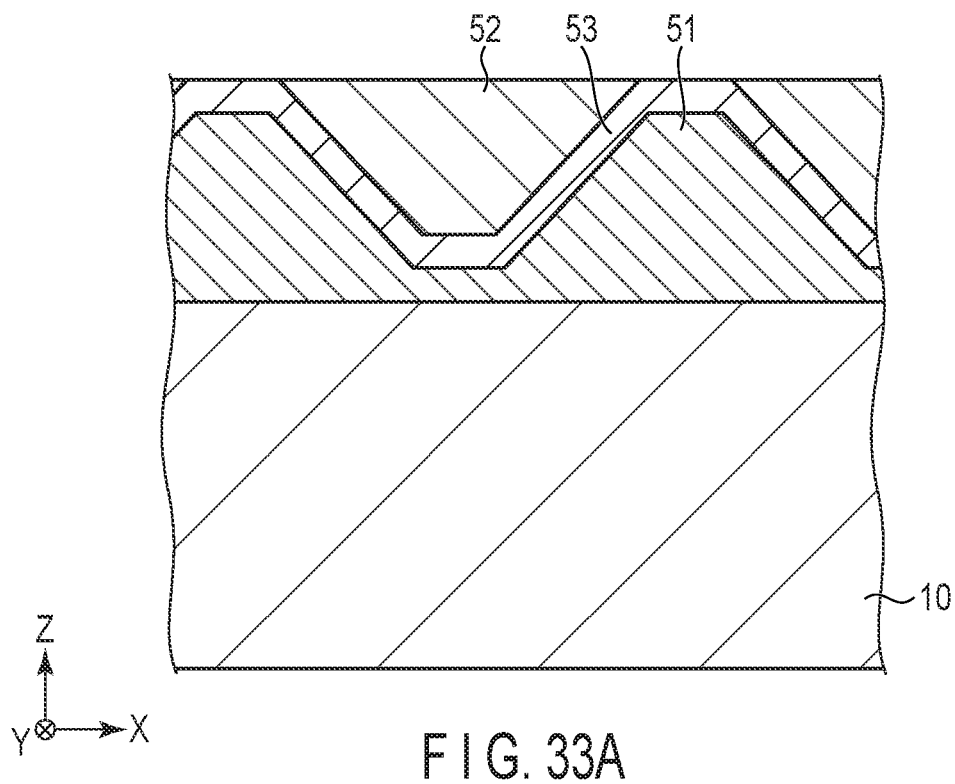
Figure 33B:
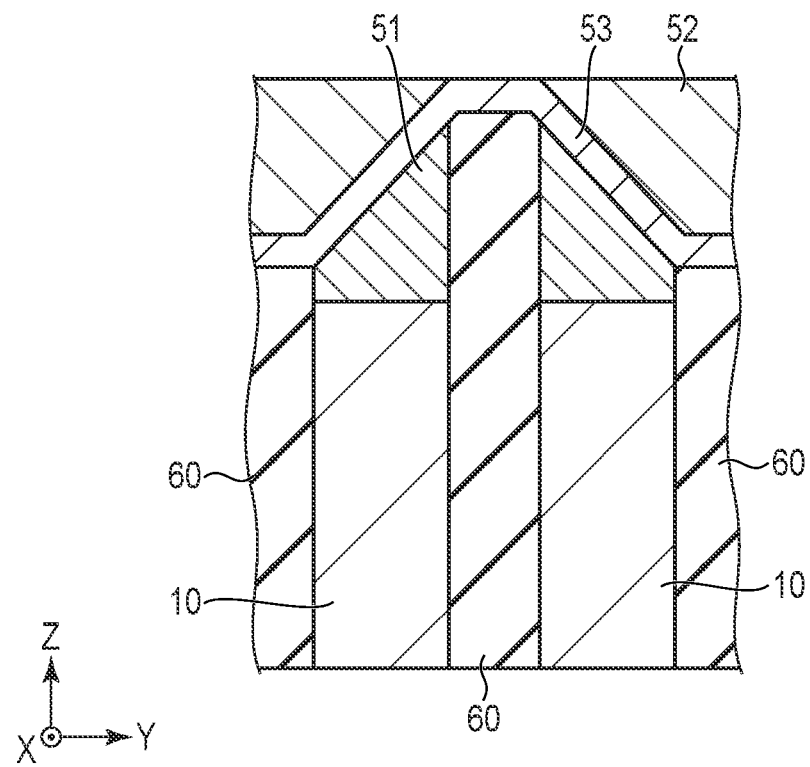

Next, as illustrated in FIGS. 33A and 33B, a conductive layer for the second electrode 52 of the selector 50 is formed. Further, the conductive layer is planarized by CMP.

Figure 34A:
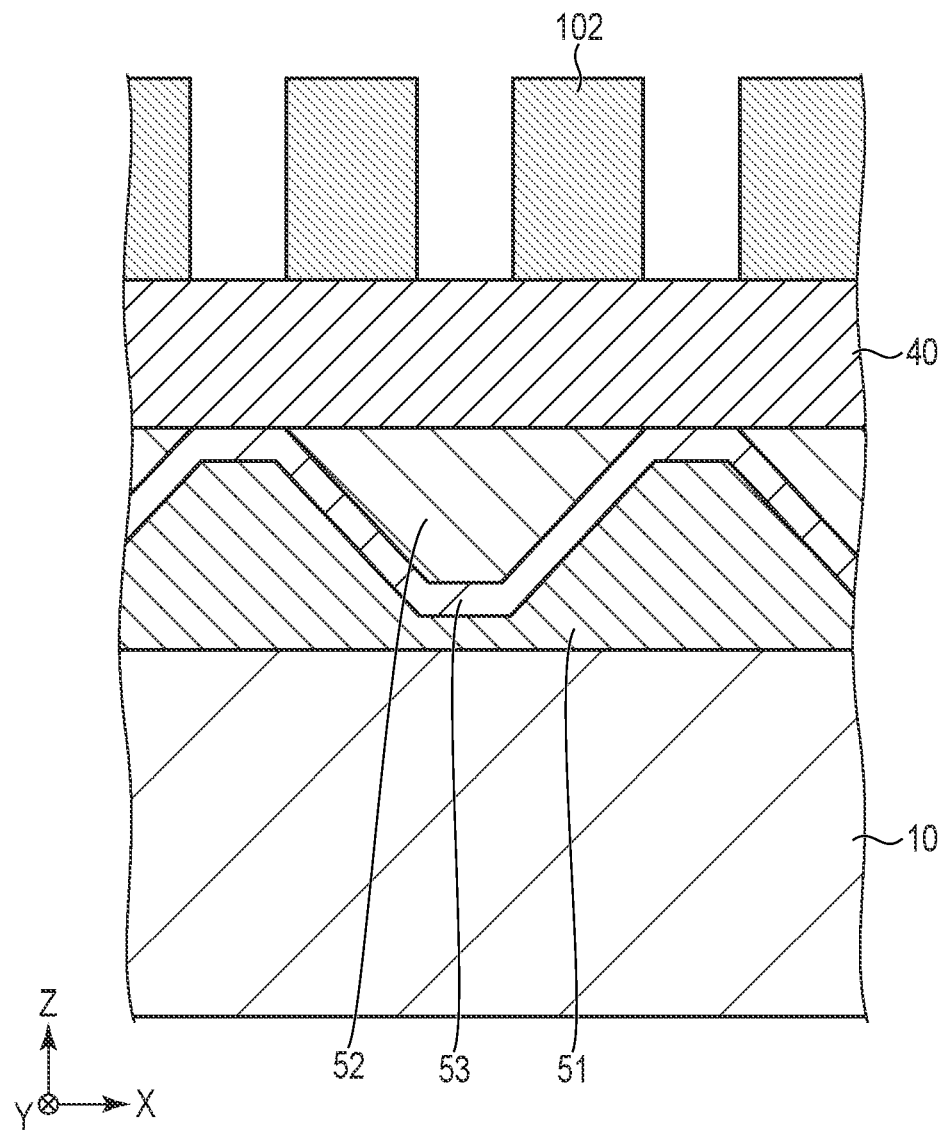
Figure 34B:
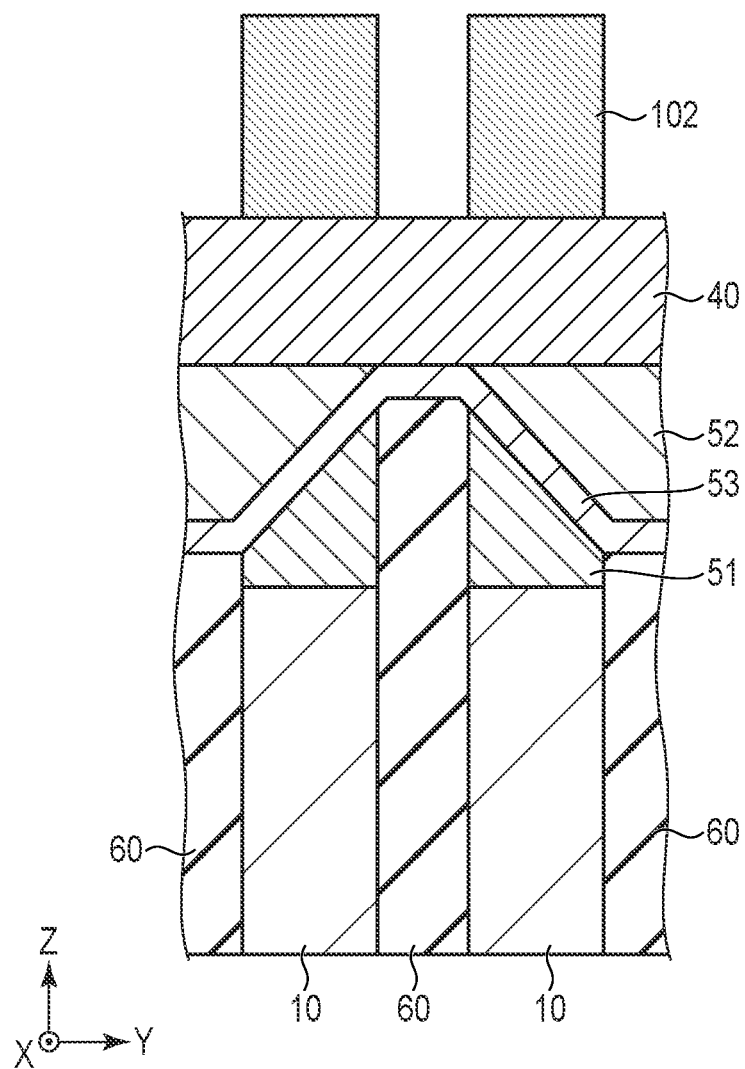

Next, as illustrated in FIGS. 34A and 34B, a layer for the magnetoresistance effect element 40 is formed on the structure obtained in the step of FIGS. 33A and 33B. That is, the storage layer 41, the reference layer 42, and the tunnel barrier layer 43 illustrated in FIG. 2 are formed as layers for the magnetoresistance effect element 40. Subsequently, a conductive mask pattern 102 informed on the layer for the magnetoresistance effect element 40.

Figure 35A:
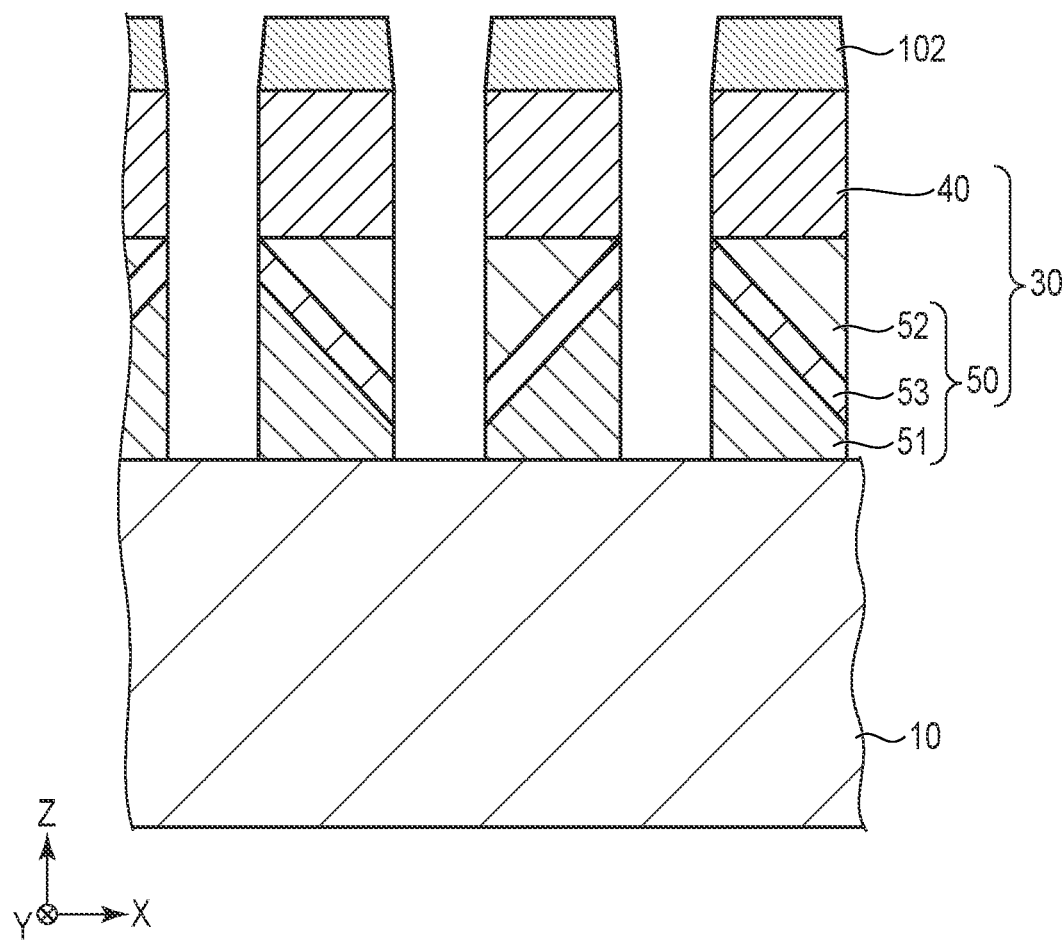
Figure 35B:
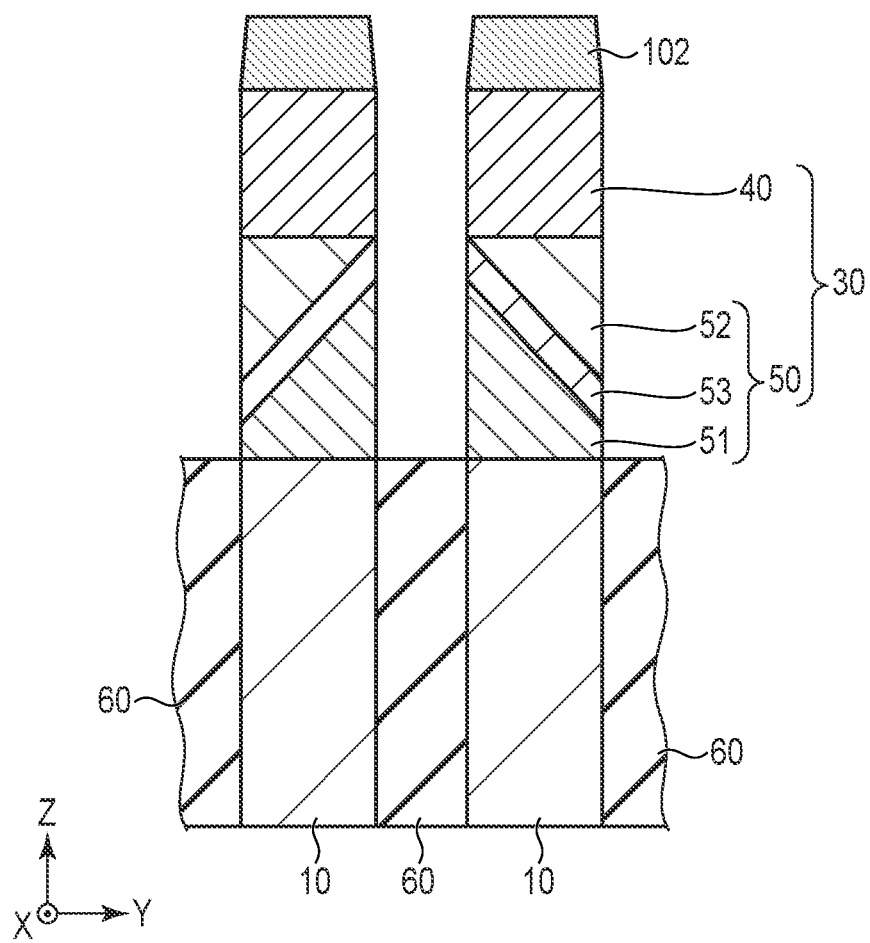

Next, as illustrated in FIGS. 35A and 35B, patterning is performed using the mask pattern 102 as a mask to form patterns of the magnetoresistance effect element 40 and the selector 50.

Figure 36A:
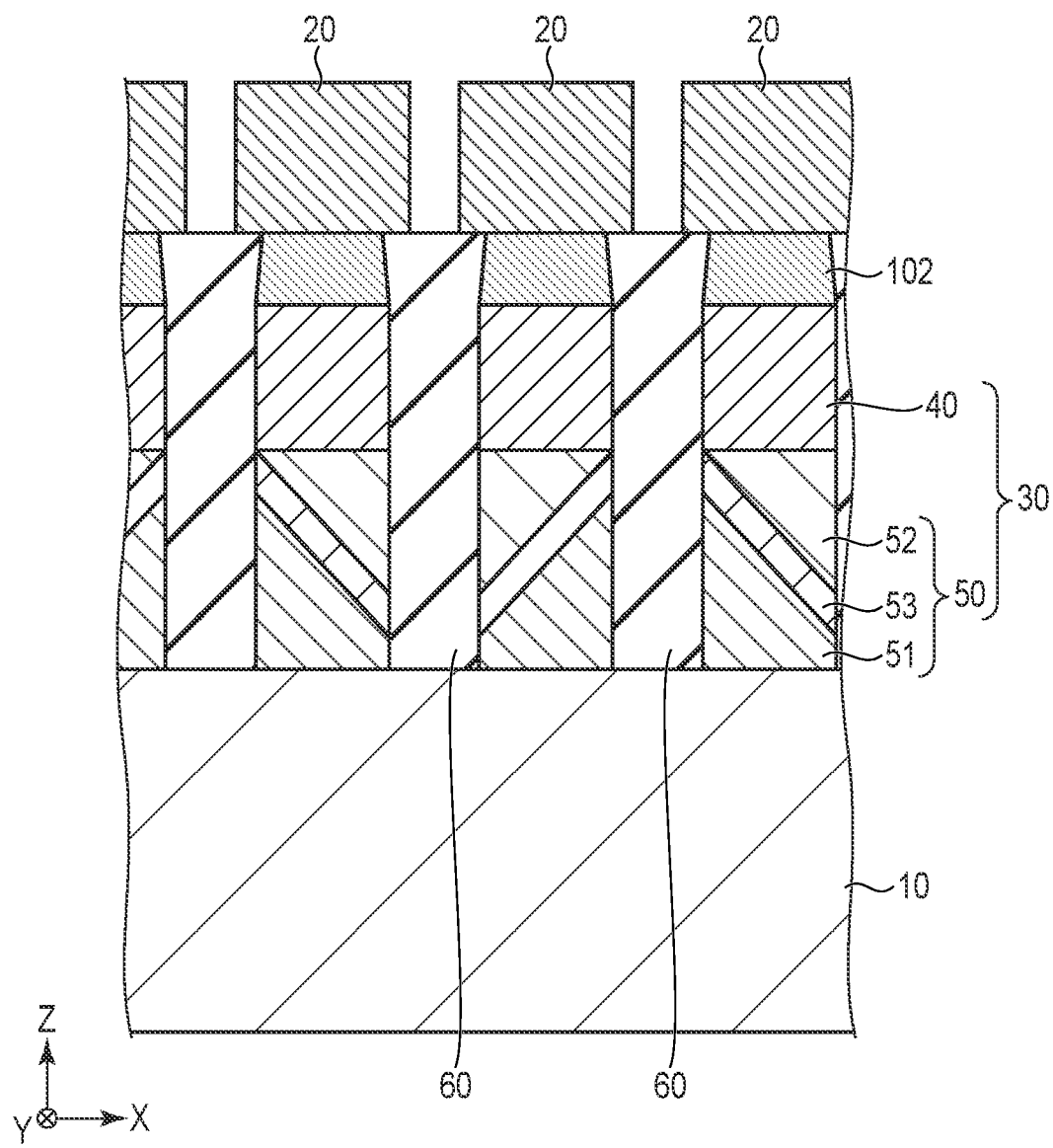
Figure 36B:
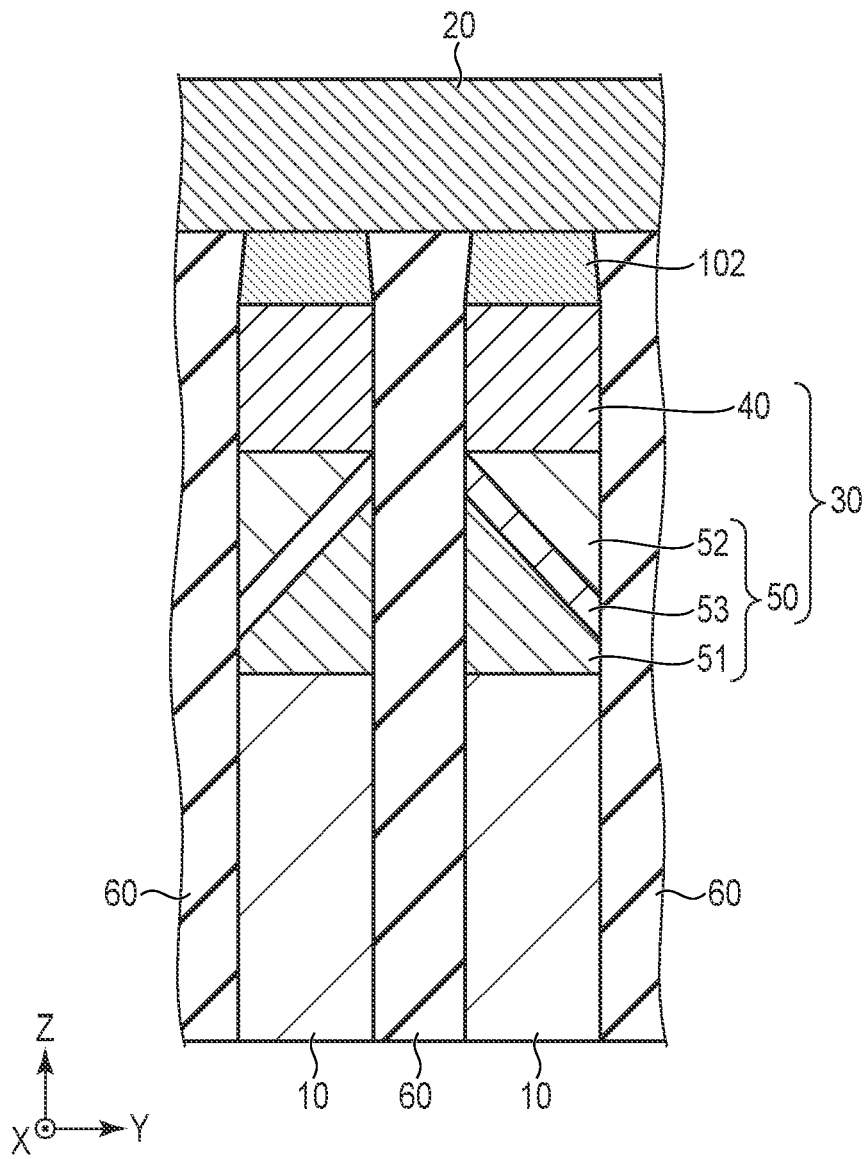

Next, as illustrated an FIGS. 36A and 36B, a region between the selectors 50, a region between the magnetoresistance effect elements 40, and a region between the mask patterns 102 are filled with an interlayer insulating film 60, and a second wiring 20 extending in the Y direction is further formed.

In the above-described manufacturing method, in the step of FIGS. 31A and 31B, the side surface of the layer for the first electrode 51 is inclined by dry etching. As a result, the selector material layer 53 can be inclined, and a cross-sectional area of a current pass between the first electrode 51 and the second electrode 52 can increase.

Note that, in the first and second embodiments described above, the magnetoresistance effect element is used as a resistance change memory element (memory element capable of storing data based on the resistance change), but other resistance change memory elements can also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising: a first memory cell; a second memory cell adjacent to the first memory cell in a first direction; and a third memory cell adjacent to the first memory cell in a second direction intersecting the first direction, each of the first, second, and third memory cells including a resistance change memory element and a switching element connected in series to the resistance change memory element, wherein
the switching element included in each of the first, second, and third memory cells includes a first electrode, a second electrode, and a switching material layer provided between the first electrode and the second electrode,
the first electrode and the second electrode of the switching element included in each of the first, second, and third memory cells overlap each other when viewed from the first direction,
the first electrode of the switching element included in the first memory cell and the first electrode of the switching element included in the second memory cell are apart from each other, and
the switching material layer of the switching element included in the first memory cell and the switching material layer of the switching element included in the second memory cell are continuously provided.

2. The device according to claim 1, wherein
the second electrode of the switching element included in the first memory cell and the second electrode of the switching element included in the second memory cell are continuously provided.

3. The device according to claim 1, wherein
the first electrode and the second electrode of the switching element included in each of the first, second, and third memory cells overlap each other when viewed from the second direction,
the first electrode of the switching element included in the first memory cell and the first electrode of the switching element included in the third memory cell are apart frame each other, and
the switching material layer of the switching element included in the first memory cell and the switching material layer of the switching element included in the third memory cell are continuously provided.

4. The device according to claim 3, wherein
the second electrode of the switching element included in the first memory cell and the second electrode of the switching element included in the third memory cell are apart frame each other.

5. The device according to claim 1, wherein
the switching material layer has a recess, and at least a part of the first electrode is provided in the recess of the switching material layer.

6. The device according to claim 5, wherein
a corner of the recess of the switching material layer is rounded.

7. The device according to claim 5, wherein
a side surface of the recess of the switching material layer is inclined.

8. The device according to claim 1, wherein
a thickness of the switching material layer is thinner than half of a pitch between the first memory cell and the second memory cell and thinner than half of a pitch between the first memory cell and the third memory cell.

9. The device according to claim 1, wherein
the first electrode and the second electrode of the switching element are formed of a same material.

10. The device according to claim 1, wherein
the switching element has a characteristic that a resistance value decreases as an applied voltage increases.

11. The device according to claim 1, wherein
the resistance change memory element is a magnetoresistance effect element.

* * * * *